United States Patent
Tran et al.

(10) Patent No.: US 11,158,374 B2
(45) Date of Patent: *Oct. 26, 2021

(54) TEMPERATURE COMPENSATION FOR MEMORY CELLS IN AN ANALOG NEURAL MEMORY SYSTEM USED IN A DEEP LEARNING NEURAL NETWORK

(71) Applicant: Silicon Storage Technology, Inc., San Jose, CA (US)

(72) Inventors: Hieu Van Tran, San Jose, CA (US); Steven Lemke, Boulder Creek, CA (US); Nhan Do, Saratoga, CA (US); Vipin Tiwari, Dublin, CA (US); Mark Reiten, Alamo, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/930,777

(22) Filed: Jul. 16, 2020

(65) Prior Publication Data

US 2020/0350015 A1 Nov. 5, 2020

Related U.S. Application Data

(63) Continuation of application No. 16/183,250, filed on Nov. 7, 2018, now Pat. No. 10,755,783.

(Continued)

(51) Int. Cl.
  *G11C 16/04* (2006.01)
  *G06F 17/16* (2006.01)

(Continued)

(52) U.S. Cl.
  CPC .......... *G11C 16/0425* (2013.01); *G06F 17/16* (2013.01); *G06N 3/0635* (2013.01); *G06N 3/04* (2013.01); *G06N 3/08* (2013.01)

(58) Field of Classification Search
  CPC .... G11C 16/0425; G06F 17/16; G06N 3/0635
  See application file for complete search history.

(56) References Cited

U.S. PATENT DOCUMENTS 3,668,440 A 6/1972 Davis et al.
5,029,130 A 7/1991 Yeh
(Continued)

OTHER PUBLICATIONS

Guo, et al., "Temperature-Insensitive Analog Vector-by-Matrix Multiplier Based on 55 nm NOR Flash Memory Cells," IEEE, Apr. 30, 2017, pp. 1-4.

(Continued)

*Primary Examiner* — Tri M Hoang
(74) *Attorney, Agent, or Firm* — DLA Piper LLP US

(57) ABSTRACT

Numerous embodiments are disclosed for providing temperature compensation in a an analog memory array. The analog memory array optionally is a vector-by-matrix multiplier in an analog neuromorphic memory system used in a deep learning neural network. One embodiment comprises measuring an operating temperature within a memory array and applying, by a temperature compensation block, a bias voltage to a terminal of a memory cell in the array, wherein the bias voltage is a function of the operating temperature.

20 Claims, 38 Drawing Sheets

Related U.S. Application Data

(60) Provisional application No. 62/723,398, filed on Aug. 27, 2018.

(51) Int. Cl.
   *G06N 3/063* (2006.01)
   *G06N 3/08* (2006.01)
   *G06N 3/04* (2006.01)

(56) References Cited

U.S. PATENT DOCUMENTS

| | | | |
|---|---|---|---|
| 6,359,499 B1 | 3/2002 | Song | |
| 6,747,310 B2 | 6/2004 | Fan | |
| 2010/0001711 A1* | 1/2010 | Marinca | G05F 3/30 323/313 |
| 2014/0029335 A1* | 1/2014 | Mu | G11C 29/021 365/185.2 |
| 2015/0154910 A1 | 6/2015 | Okuno | |
| 2015/0310938 A1 | 10/2015 | Kim | |
| 2017/0031259 A1 | 2/2017 | Gerstner | |
| 2017/0077182 A1 | 3/2017 | Strukov | |
| 2017/0337466 A1 | 11/2017 | Bayat | |
| 2017/0337980 A1 | 11/2017 | Guo | |
| 2019/0164617 A1 | 5/2019 | Tran | |

OTHER PUBLICATIONS

Bayat, et al., "Model-Based High-Precision Tuning of NOR Flash Memory Cells for Analog Computing Applications," 2016 74th Annual Device Research Conference, IEEE, Jun. 19, 2016, pp. 1-2.

Do, et al., "A 55 nm Logic-Process-Compatible, Split-Gate Flash Memory Array Fully Demonstrated at Automotive Temperature with High Access Speed and Reliability," IEEE International Memory Workshop, May 17-20, 2015, pp. 1-3.

* cited by examiner

TEMPERATURE COMPENSATION FOR MEMORY CELLS IN AN ANALOG NEURAL MEMORY SYSTEM USED IN A DEEP LEARNING NEURAL NETWORK

PRIORITY CLAIMS

This application claims priority to U.S. patent application Ser. No. 16/183,250, filed on Nov. 7, 2018, titled, "Temperature And Leakage Compensation For Memory Cells in an Analog Neural Memory System Used in a Deep Learning Neural Network," and issued as U.S. Pat. No. 10,755,783, which claims priority to U.S. Provisional Patent Application No. 62/723,398, filed on Aug. 27, 2018, and titled, "Temperature And Leakage Compensation For Memory Cells in an Analog Neural Memory System Used in a Deep Learning Neural Network," both of which are incorporated by reference herein.

FIELD OF THE INVENTION

Numerous embodiments are disclosed for providing temperature compensation and leakage compensation for memory cells in an analog neuromorphic memory system used in a deep learning neural network.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as an analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neuromorphic memory system must be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256.

One challenge of implementing analog neuro memory systems is that extreme precision is required for erase, program, and read operations of each cell, as each floating gate in each cell may be required to hold one of N values, where N is greater than the conventional value of 2 used in conventional flash memory systems. However, the characteristics of each device, such as its current-voltage response characteristic curve, will change as its operating temperature changes. In addition, leakage in the device will further affect its characteristics.

What is needed is a system for providing temperature compensation and leakage compensation for memory cells in an analog neural memory system used in a deep learning neural network, to ensure that precision and accuracy is maintained in the operation of each memory cell as the operating temperature of the cell changes.

SUMMARY OF THE INVENTION

Numerous embodiments are disclosed for providing temperature compensation and leakage compensation for an analog neural memory system used in a deep learning neural network. The embodiments for providing temperature compensation include discreet or continuous adaptive slope compensation and renormalization. The embodiments for providing leakage compensation include adaptive erase gate coupling, negative bias on the control gate terminal, negative bias on the word line terminal, and a bias on the source line terminal.

DETAILED DESCRIPTION OF THE INVENTION

The artificial neural networks of the present invention utilize a combination of CMOS technology and non-volatile memory arrays.

Non-Volatile Memory Cells

Figure 1:
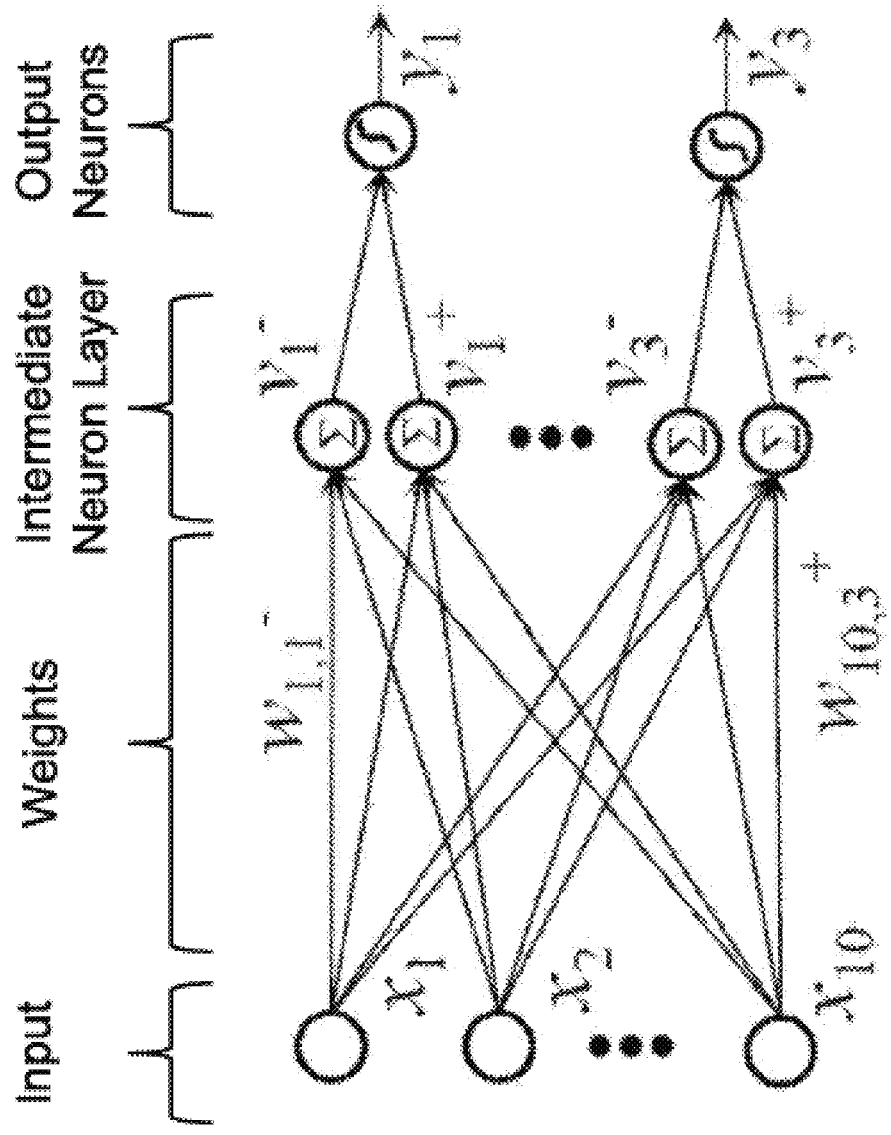
FIG. 1 is a diagram that illustrates a prior art artificial neural network.
Figure 2:
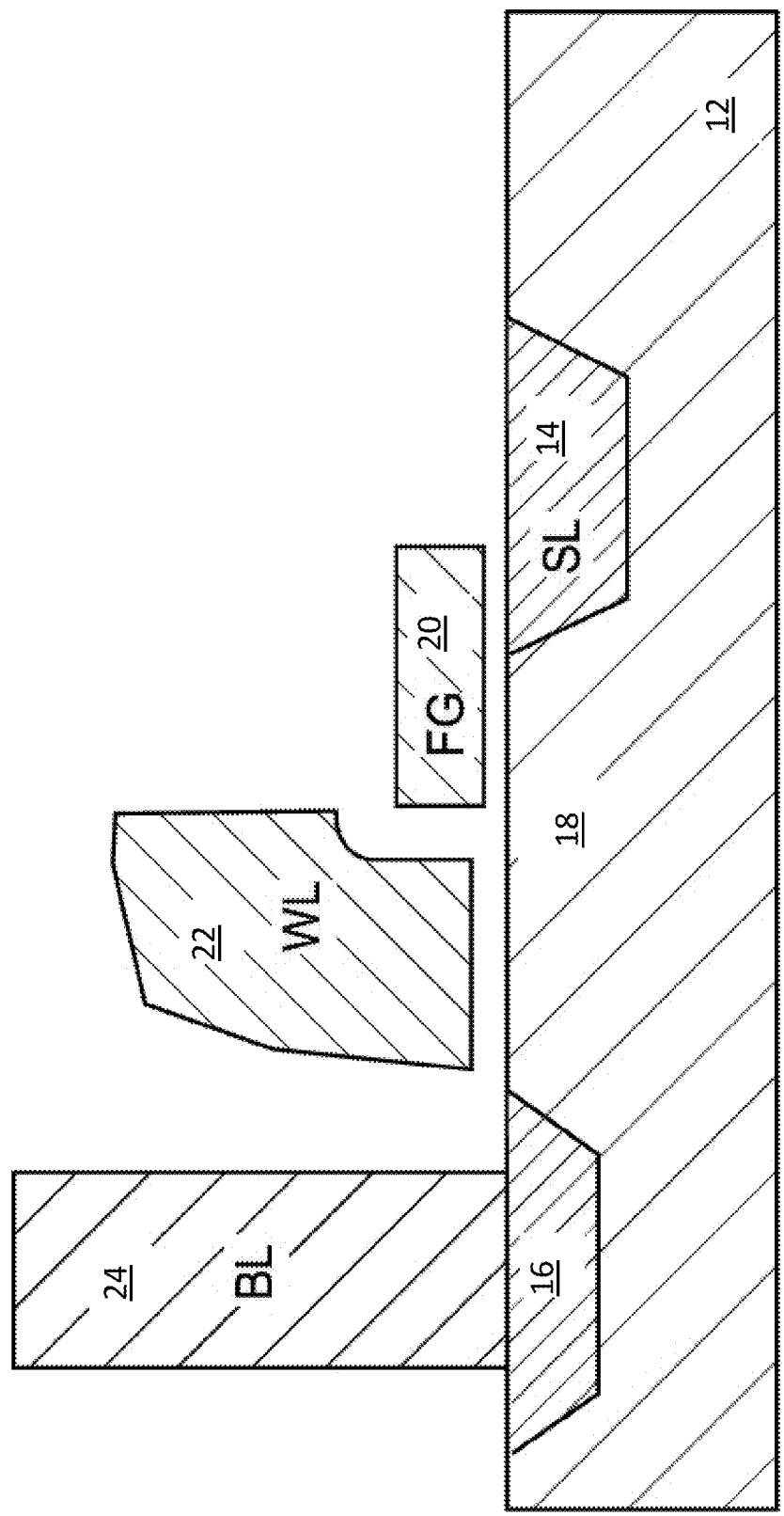
FIG. 2 is a cross-sectional side view of a conventional 2-gate non-volatile memory cell.

Digital non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in a semiconductor substrate 12, with a channel region 18 there between. A floating gate 20 is formed over and insulated from (and controls the conductivity of) a first portion of the channel region 18, and over a portion of the source region 14. A word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the source region 14 towards the drain region 16. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 210 for performing read, erase, and program operations:

TABLE NO. 1

Operation of Flash Memory Cell 210 of FIG. 2

|  | WL | BL | SL |
|---|---|---|---|
| Read | 2-3 V | 0.6-2 V | 0 V |
| Erase | ~11-13 V | 0 V | 0 V |
| Program | 1-2 V | 1-3 μA | 9-10 V |

Figure 3:
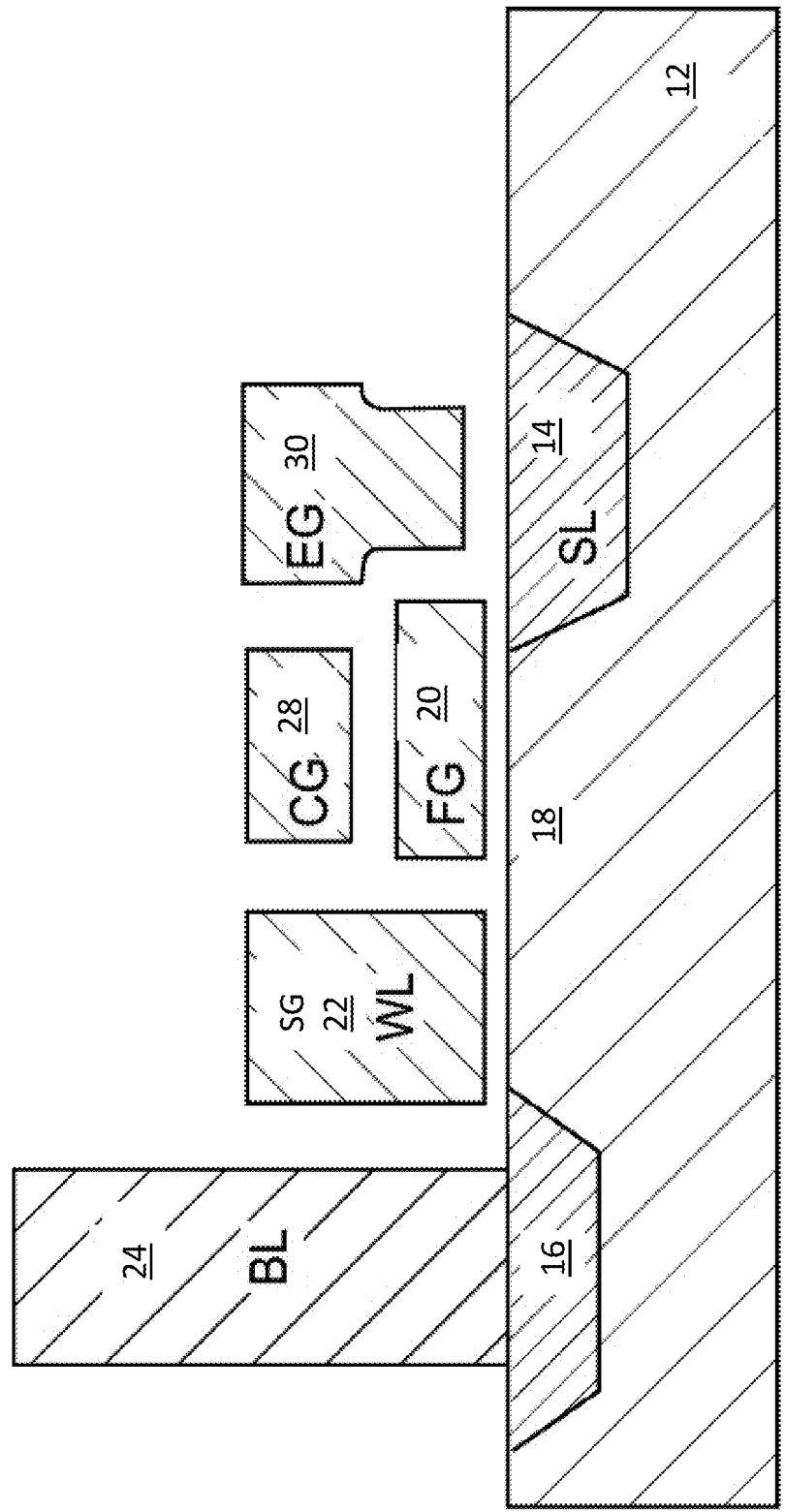
FIG. 3 is a cross-sectional side view of a conventional 4-gate non-volatile memory cell.

Other split gate memory cell configurations, which are other types of flash memory cells, are known. For example, FIG. 3 depicts a four-gate memory cell 310 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 310 for performing read, erase, and program operations:

TABLE NO. 2

Operation of Flash Memory Cell 310 of FIG. 3

|  | WL/SG | BL | CG | EG | SL |
|---|---|---|---|---|---|
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 1 μA | 8-11 V | 4.5-9 V | 4.5-5 V |

Figure 4:
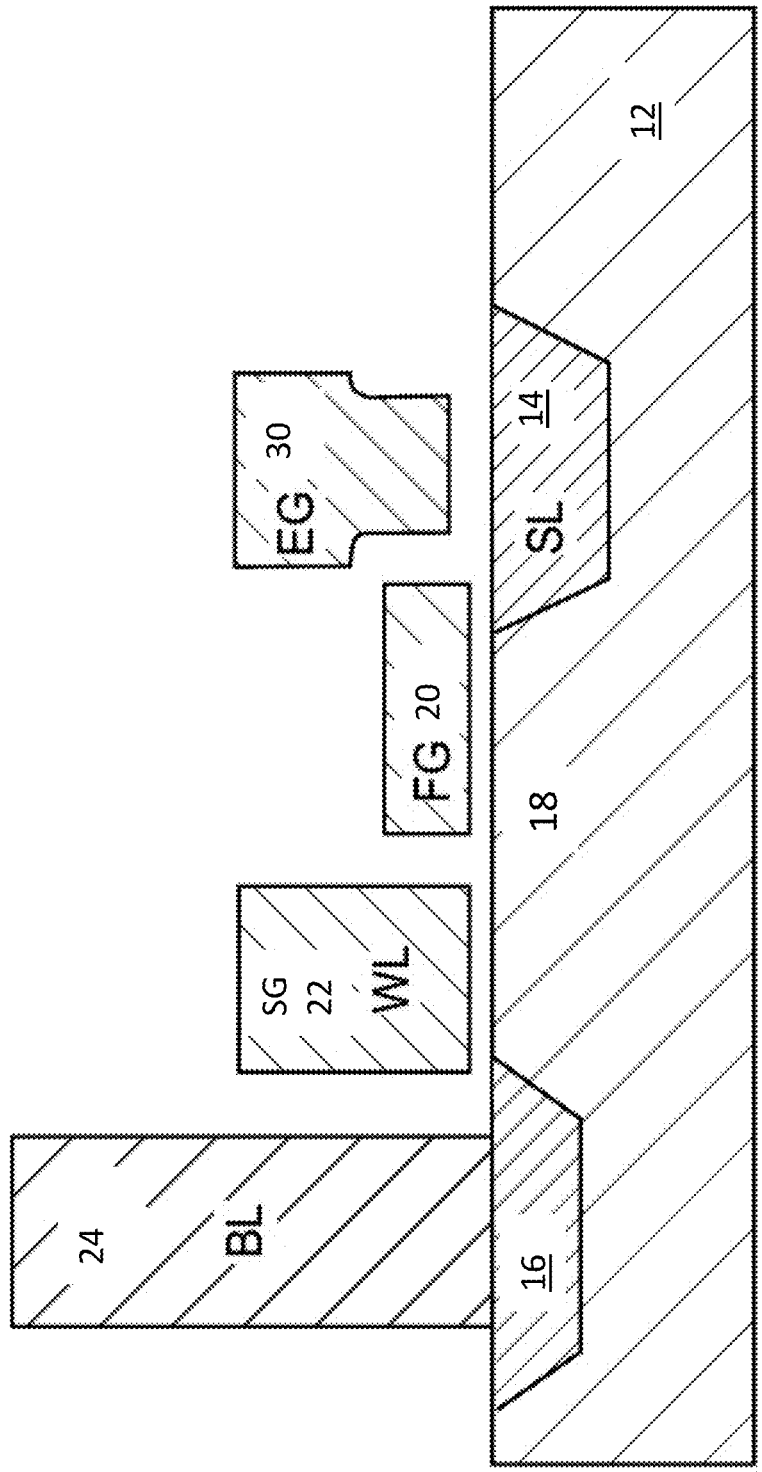
FIG. 4 is a side cross-sectional side view of conventional 3-gate non-volatile memory cell.

FIG. 4 depicts a three-gate memory cell 410, which is another type of flash memory cell. Memory cell 410 is identical to the memory cell 310 of FIG. 3 except that memory cell 410 does not have a separate control gate. The erase operation (whereby erasing occurs through use of the erase gate) and read operation are similar to that of the FIG. 3 except there is no control gate bias applied. The programming operation also is done without the control gate bias, and as a result, a higher voltage must be applied on the source line during a program operation to compensate for a lack of control gate bias.

Table No. 3 depicts typical voltage ranges that can be applied to the terminals of memory cell 410 for performing read, erase, and program operations:

TABLE NO. 3

Operation of Flash Memory Cell 410 of FIG. 4

|  | WL/SG | BL | EG | SL |
|---|---|---|---|---|
| Read | 0.7-2.2 V | 0.6-2 V | 0-2.6 V | 0 V |
| Erase | −0.5 V/0 V | 0 V | 11.5 V | 0 V |
| Program | 1 V | 2-3 μA | 4.5 V | 7-9 V |

Figure 5:
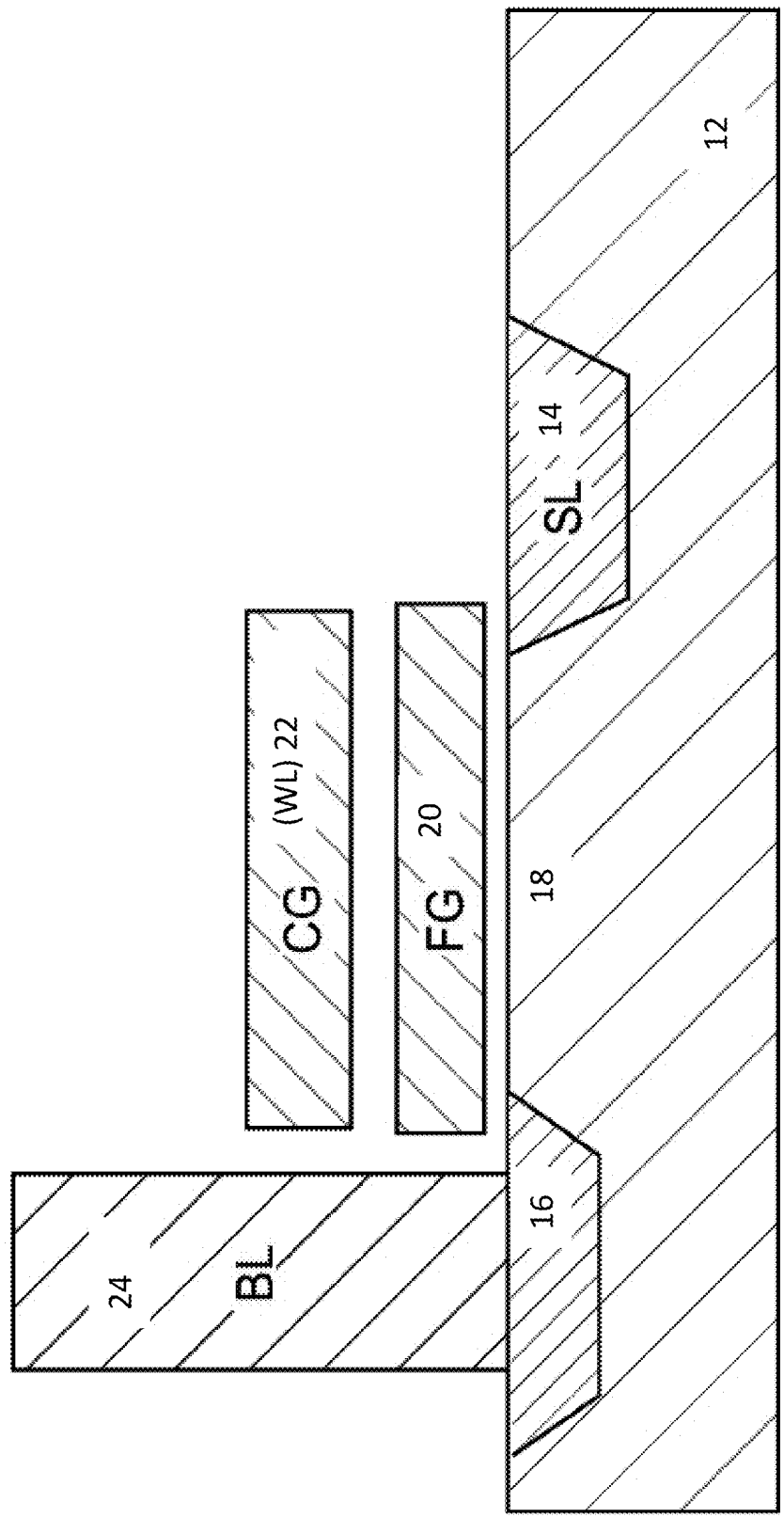
FIG. 5 is a cross-sectional side view of another conventional 2-gate non-volatile memory cell.

FIG. 5 depicts stacked gate memory cell 510, which is another type of flash memory cell. Memory cell 510 is similar to memory cell 210 of FIG. 2, except that floating gate 20 extends over the entire channel region 18, and control gate 22 (which here will be coupled to a word line) extends over floating gate 20, separated by an insulating layer (not shown). The erase, programming, and read operations operate in a similar manner to that described previously for memory cell 210.

Table No. 4 depicts typical voltage ranges that can be applied to the terminals of memory cell 510 and substrate 12 for performing read, erase, and program operations:

TABLE NO. 4

Operation of Flash Memory Cell 510 of FIG. 5

|  | CG | BL | SL | Substrate |
|---|---|---|---|---|
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

Neural Networks Employing Non-Volatile Memory Cell Arrays

Figure 6:
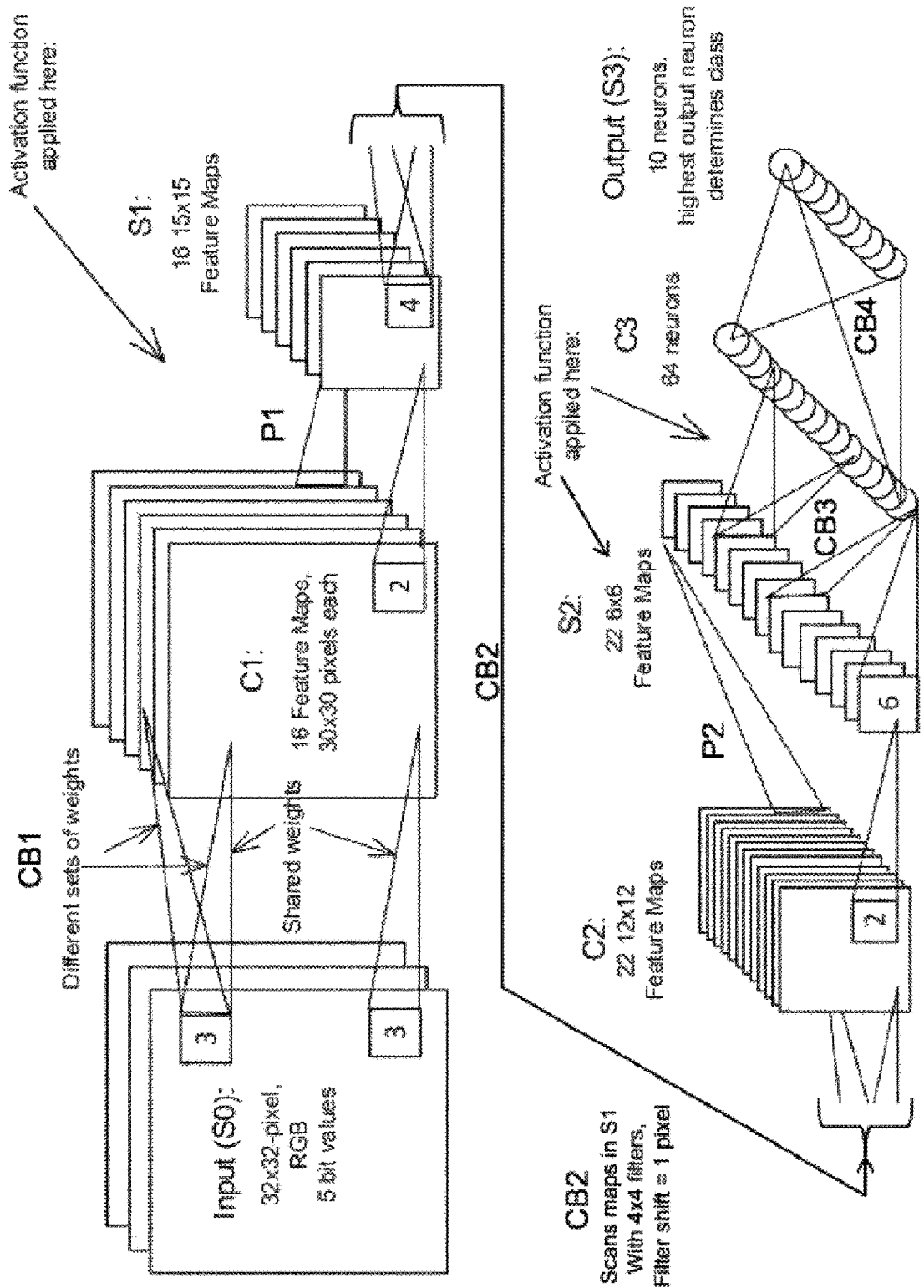
FIG. 6 is a diagram illustrating the different levels of an exemplary artificial neural network utilizing a non-volatile memory array.

FIG. 6 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

Figure 7:
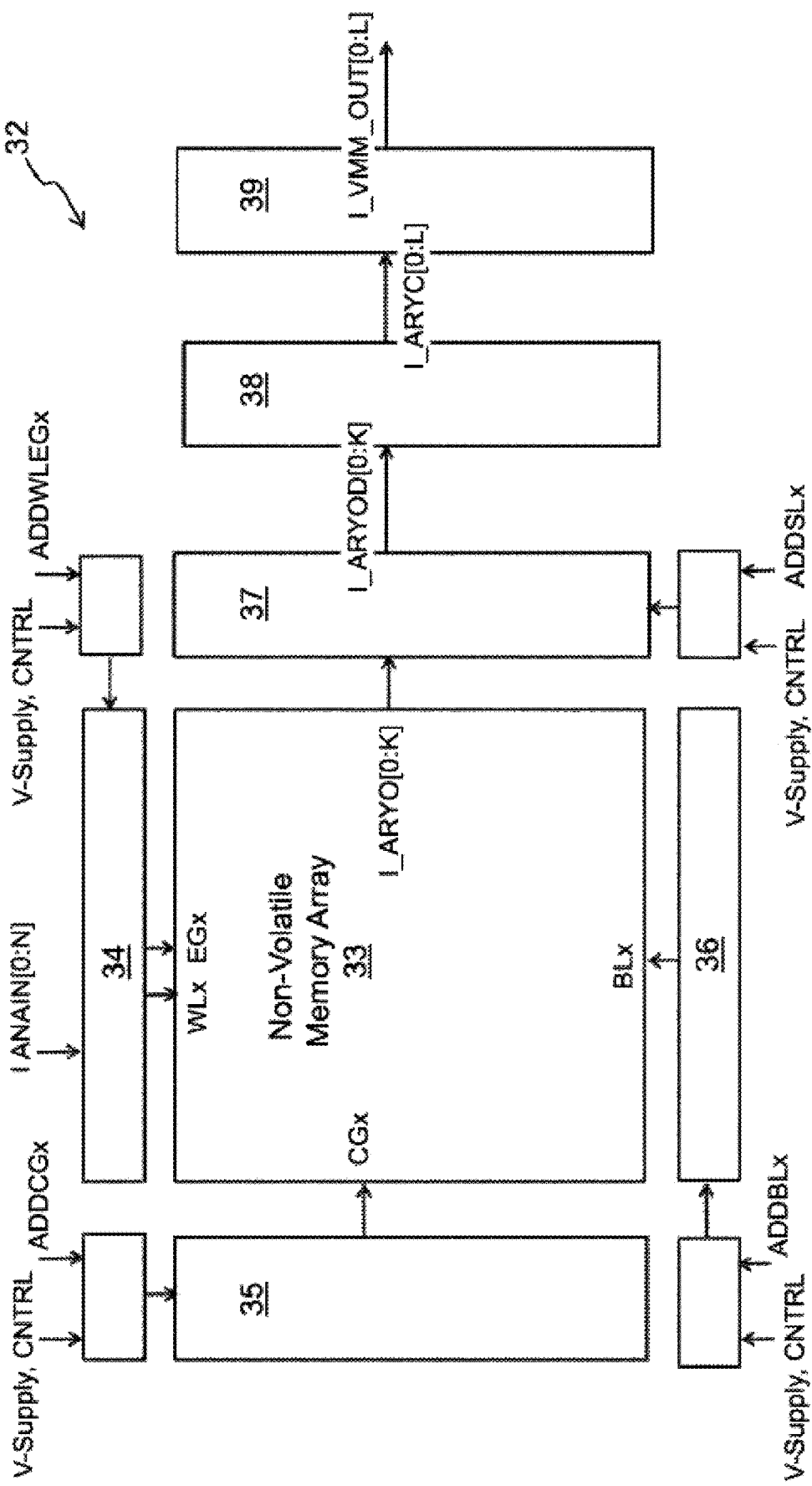
FIG. 7 is a block diagram illustrating a vector multiplier matrix.

FIG. 7 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 negates the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed up output values of differential summer 38 are then supplied to an activation function circuit 39, which rectifies the output. The activation function circuit 39 may provide sigmoid, tan h, or ReLU functions. The rectified output values of activation function circuit 39 become an element of a feature map as the next layer (e.g. C1 in FIG. 6), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summing op-amp 38 and activation function circuit 39 constitute a plurality of neurons.

The input to VMM array 32 in FIG. 7 (WLx, EGx, CGx, and optionally BLx and SLx) can be analog level, binary level, or digital bits (in which case a DAC is provided to convert digital bits to appropriate input analog level) and the output can be analog level, binary level, or digital bits (in which case an output ADC is provided to convert output analog level into digital bits).

Figure 8:
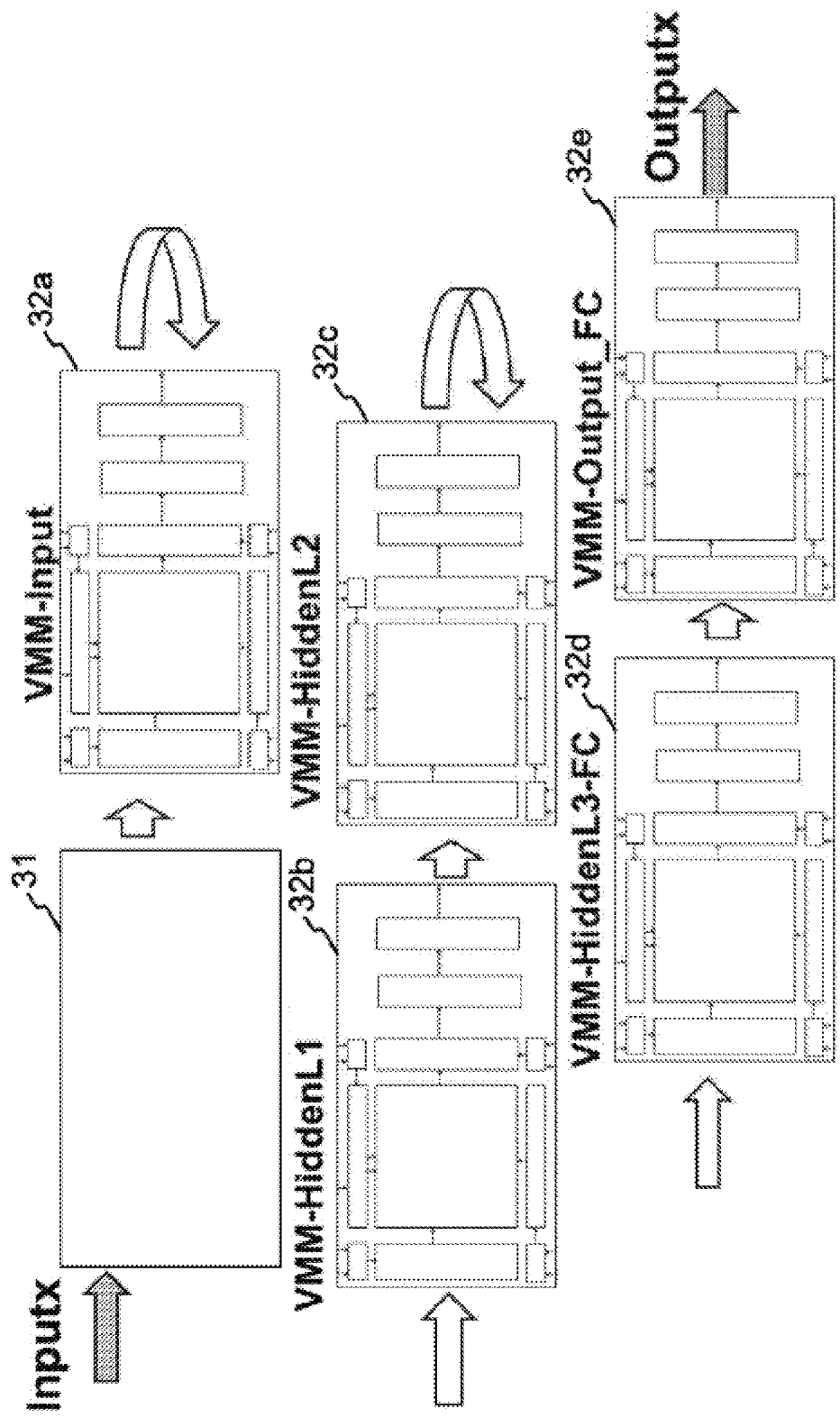
FIG. 8 is a block diagram illustrating various levels of a vector multiplier matrix.

FIG. 8 is a block diagram depicting the usage of numerous layers of VMM arrays 32, here labeled as VMM arrays 32a, 32b, 32c, 32d, and 32e. As shown in FIG. 8, the input, denoted Inputx, is converted from digital to analog by a digital-to-analog converter 31, and provided to input VMM array 32a. The converted analog inputs could be voltage or current. The input D/A conversion for the first layer could be done by using a function or a LUT (look up table) that maps the inputs Inputx to appropriate analog levels for the matrix multiplier of input VMM array 32a. The input conversion could also be done by an analog to analog (A/A) converter to convert an external analog input to a mapped analog input to the input VMM array 32a.

The output generated by input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 8 contains five layers (32a, 32b, 32c, 32d, 32e): one input layer (32a), two hidden layers (32b, 32c), and two fully connected layers (32d, 32e). One of ordinary skill in the art will appreciate that this is merely exemplary and that a system instead could comprise more than two hidden layers and more than two fully connected layers.

Vector-by-Matrix Multiplication (VMM) Arrays

Figure 9:
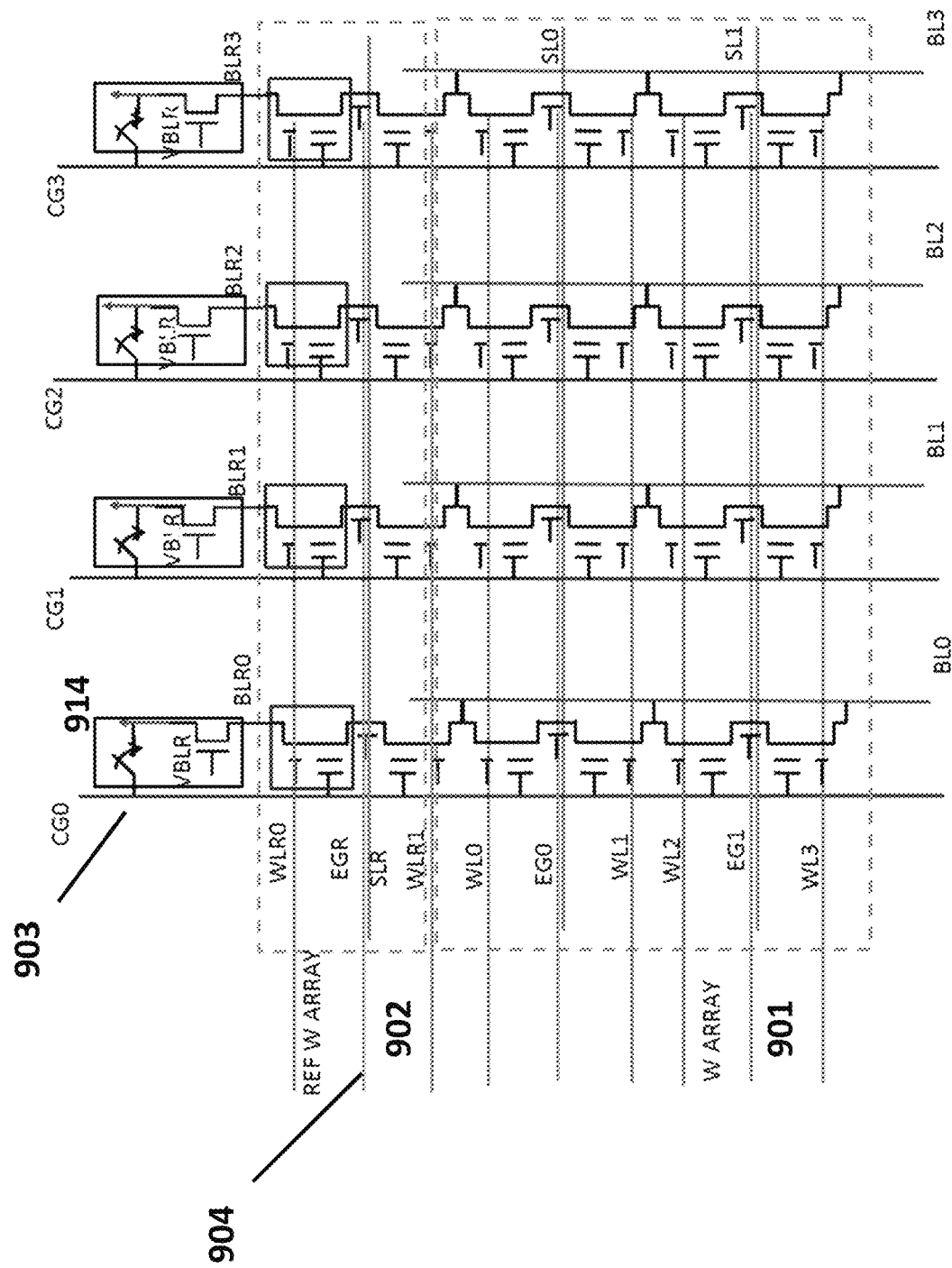
FIG. 9 depicts another embodiment of a vector multiplier matrix.

FIG. 9 depicts neuron VMM array 900, which is particularly suited for memory cells 310 as shown in FIG. 3, and is utilized as the synapses and parts of neurons between an input layer and the next layer. VMM array 900 comprises memory array 901 of non-volatile memory cells and reference array 902 (at the top of the array) of non-volatile reference memory cells. Alternatively, another reference array can be placed at the bottom.

In VMM array 900, control gate lines, such as control gate line 903, run in a vertical direction (hence reference array 902 in the row direction is orthogonal to control gate line 903), and erase gate lines, such as erase gate line 904, run in a horizontal direction. Here, the inputs to VMM array 900 are provided on the control gate lines (CG0, CG1, CG2, CG3), and the output of VMM array 900 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 900, i.e. the flash memory of VMM array 900, are preferably configured to operate in a sub-threshold region.

The non-volatile reference memory cells and the non-volatile memory cells described herein are biased in weak inversion:

$$Ids = Io * e^{(Vg-Vth)/kVt} = w * Io * e^{(Vg)/kVt},$$
$$w = e^{(-Vth)/kVt}$$
where For an I-to-V log converter using a memory cell (such as a reference memory cell or a peripheral memory cell) or a transistor to convert input current into an input voltage:

$$Vg = k * Vt * \log[Ids/wp * Io]$$

Here, wp is w of a reference or peripheral memory cell.

For a memory array used as a vector matrix multiplier VMM array, the output current is:

$$Iout = wa * Io * e^{(Vg)/kVt}, \text{ namely}$$

$$Iout = (wa/wp) * Iin = W * Iin$$

$$W = e^{(Vthp - Vtha)/kVt}$$

Here, wa=w of each memory cell in the memory array.

A wordline or control gate can be used as the input for the memory cell for the input voltage.

Alternatively, the flash memory cells of VMM arrays described herein can be configured to operate in the linear region:

$$Ids = beta * (Vgs - Vth) * Vds; \; beta = u * Cox * W/L$$

$$W = \alpha(Vgs - Vth)$$

A wordline or control gate or bitline or sourceline can be used as the input for the memory cell operated in the linear region for the input voltage.

For an I-to-V linear converter, a memory cell (such as a reference memory cell or a peripheral memory cell) or a transistor operating in the linear region can be used to linearly convert an input/output current into an input/output voltage.

Other embodiments for VMM array 32 of FIG. 7 are described in U.S. patent application Ser. No. 15/826,345, which is incorporated by reference herein. As described in that application. a sourceline or a bitline can be used as the neuron output (current summation output).

Figure 10:
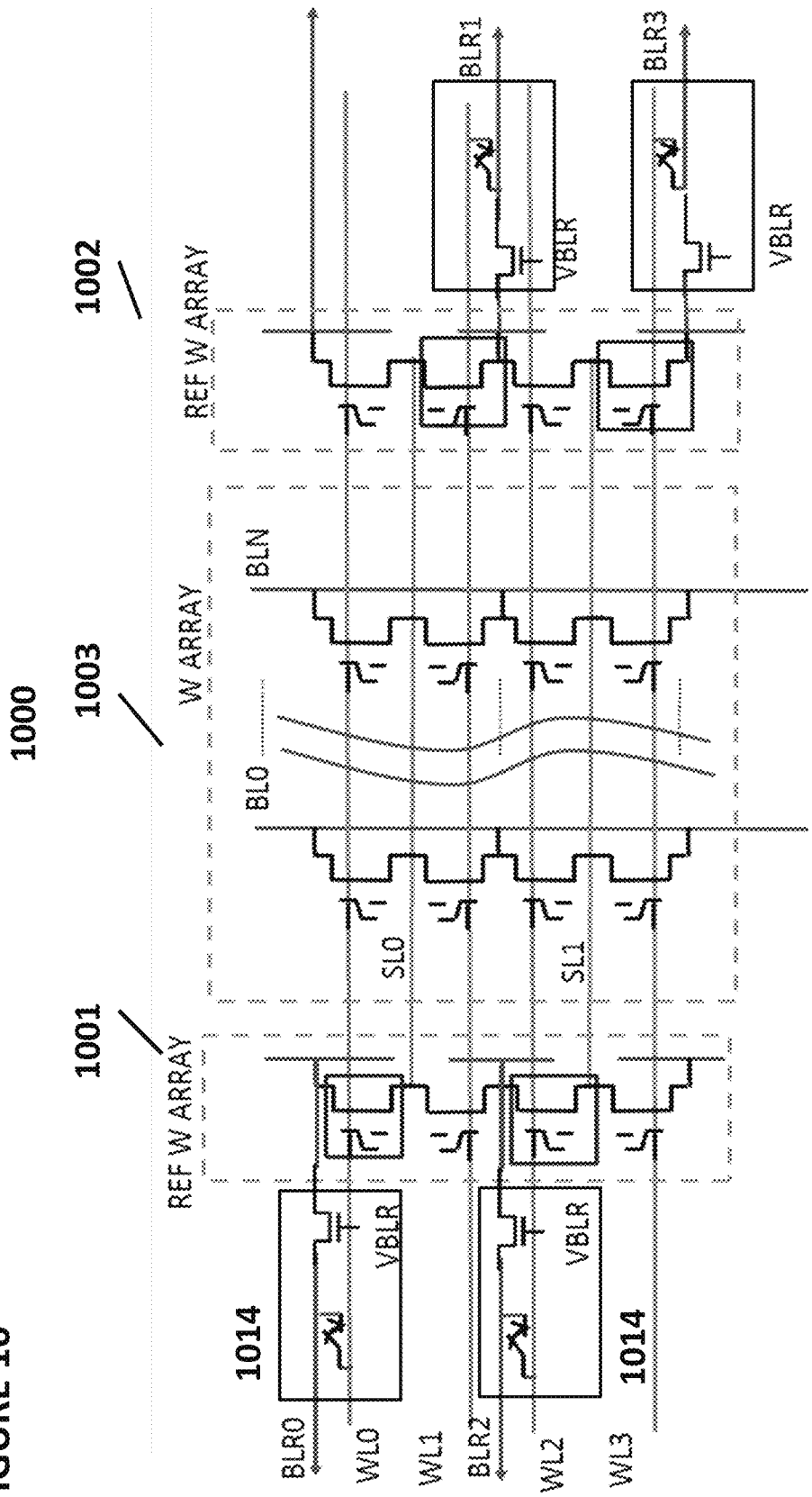
FIG. 10 depicts another embodiment of a vector multiplier matrix.

FIG. 10 depicts neuron VMM array 1000, which is particularly suited for memory cells 210 as shown in FIG. 2, and is utilized as the synapses between an input layer and the next layer. VMM array 1000 comprises a memory array 1003 of non-volatile memory cells, reference array 1001 of first non-volatile reference memory cells, and reference array 1002 of second non-volatile reference memory cells. Reference arrays 1001 and 1002, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1014 (only partially depicted) with current inputs flowing into them. The reference cells are tuned (e.g., programmed) to target reference levels. The target reference levels are provided by a reference mini-array matrix (not shown).

Memory array 1003 serves two purposes. First, it stores the weights that will be used by the VMM array 1000 on respective memory cells thereof. Second, memory array 1003 effectively multiplies the inputs (i.e. current inputs provided in terminals BLR0, BLR1, BLR2, and BLR3, which reference arrays 1001 and 1002 convert into the input voltages to supply to wordlines WL0, WL1, WL2, and WL3) by the weights stored in the memory array 1003 and then adds all the results (memory cell currents) to produce the output on the respective bit lines (BL0-BLN), which will be the input to the next layer or input to the final layer. By performing the multiplication and addition function, memory array 1003 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages for VMM array 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 5

Operation of VMM Array 1000 of FIG. 10:

| | WL | WL-unsel | BL | BL-unsel | SL | SL-unsel |
|---|---|---|---|---|---|---|
| Read | 1-3.5 V | −0.5 V/0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | −0.5 V/0 V | 0.1-3 uA | Vinh~2.5 V | 4-10 V | 0-1 V/FLT |

Figure 11:
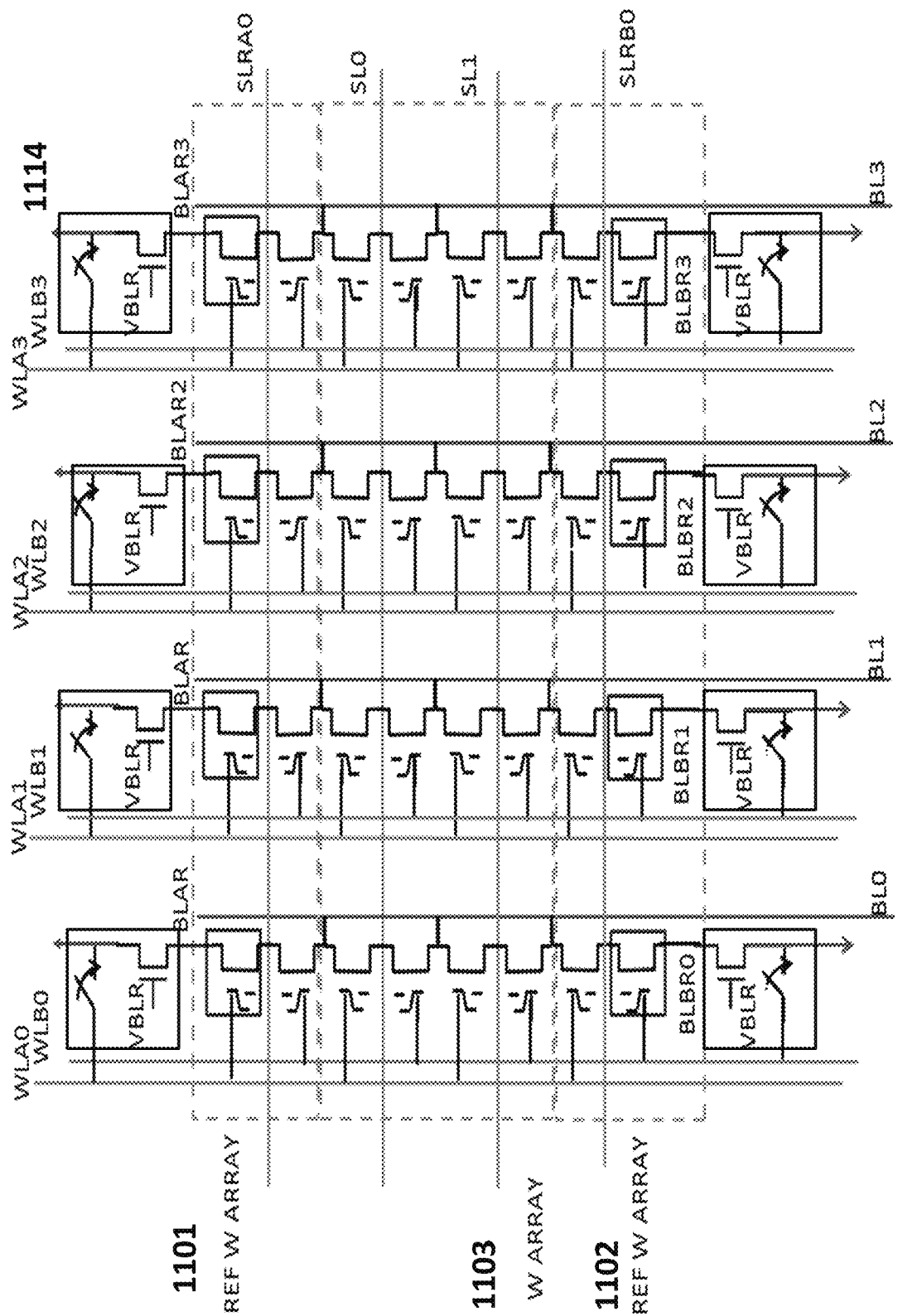
FIG. 11 depicts another embodiment of a vector multiplier matrix.

FIG. 11 depicts neuron VMM array 1100, which is particularly suited for memory cells 210 as shown in FIG. 2, and is utilized as the synapses and parts of neurons between an input layer and the next layer. VMM array 1100 comprises a memory array 1103 of non-volatile memory cells, reference array 1101 of first non-volatile reference memory cells, and reference array 1102 of second non-volatile reference memory cells. Reference arrays 1101 and 1102 run in row direction of the VMM array 1100. VMM array is similar to VMM 1000 except that in VMM array 1100, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages for VMM array 1100. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

Operation of VMM Array 1100 of FIG. 11

|  | WL | WL-unsel | BL | BL-unsel | SL | SL-unsel |
|---|---|---|---|---|---|---|
| Read | 1-3.5 V | −0.5 V/0 V | 0.6-2 V | 0.6 V-2 V/0 V | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V V/FLT |

Figure 12:
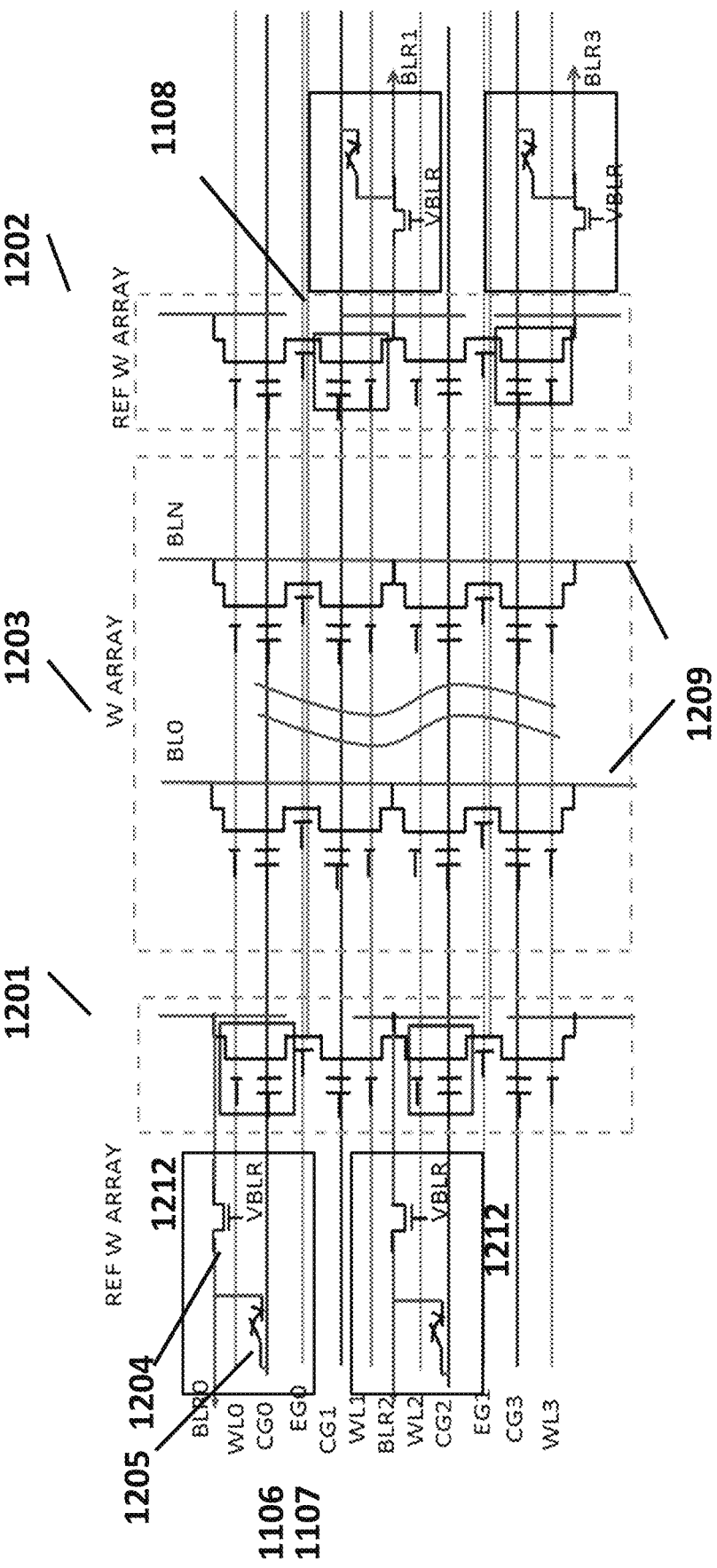
FIG. 12 depicts another embodiment of a vector multiplier matrix.

FIG. 12 depicts neuron VMM array 1200, which is particularly suited for memory cells 310 as shown in FIG. 3, and is utilized as the synapses and parts of neurons between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1212 (only partially shown) with current inputs flowing into them through BLR0, BLR1, BLR2, and BLR3. Multiplexors 1212 each include a respective multiplexor 1205 and a cascoding transistor 1204 to ensure a constant voltage on the bitline (such as BLR0) of each of the first and second non-volatile reference memory cells during a read operation. The reference cells are tuned to target reference levels.

Memory array 1203 serves two purposes. First, it stores the weights that will be used by the VMM array 1200. Second, memory array 1203 effectively multiplies the inputs (current inputs provided to terminals BLR0, BLR1, BLR2, and BLR3, for which reference arrays 1201 and 1202 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1200 implements uni-directional tuning for non-volatile memory cells in memory array 1203. That is, each non-volatile memory cell is erased and then partially programmed until the desired charge on the floating gate is reached. This can be performed, for example, using the novel precision programming techniques described below. If too much charge is placed on the floating gate (such that the wrong value is stored in the cell), the cell must be erased and the sequence of partial programming operations must start over. As shown, two rows sharing the same erase gate (such as EG0 or EG1) need to be erased together (which is known as a page erase), and thereafter, each cell is partially programmed until the desired charge on the floating gate is reached.

Table No. 7 depicts operating voltages for VMM array 1200. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

Operation of VMM Array 1200 of FIG. 12

|  | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 13:
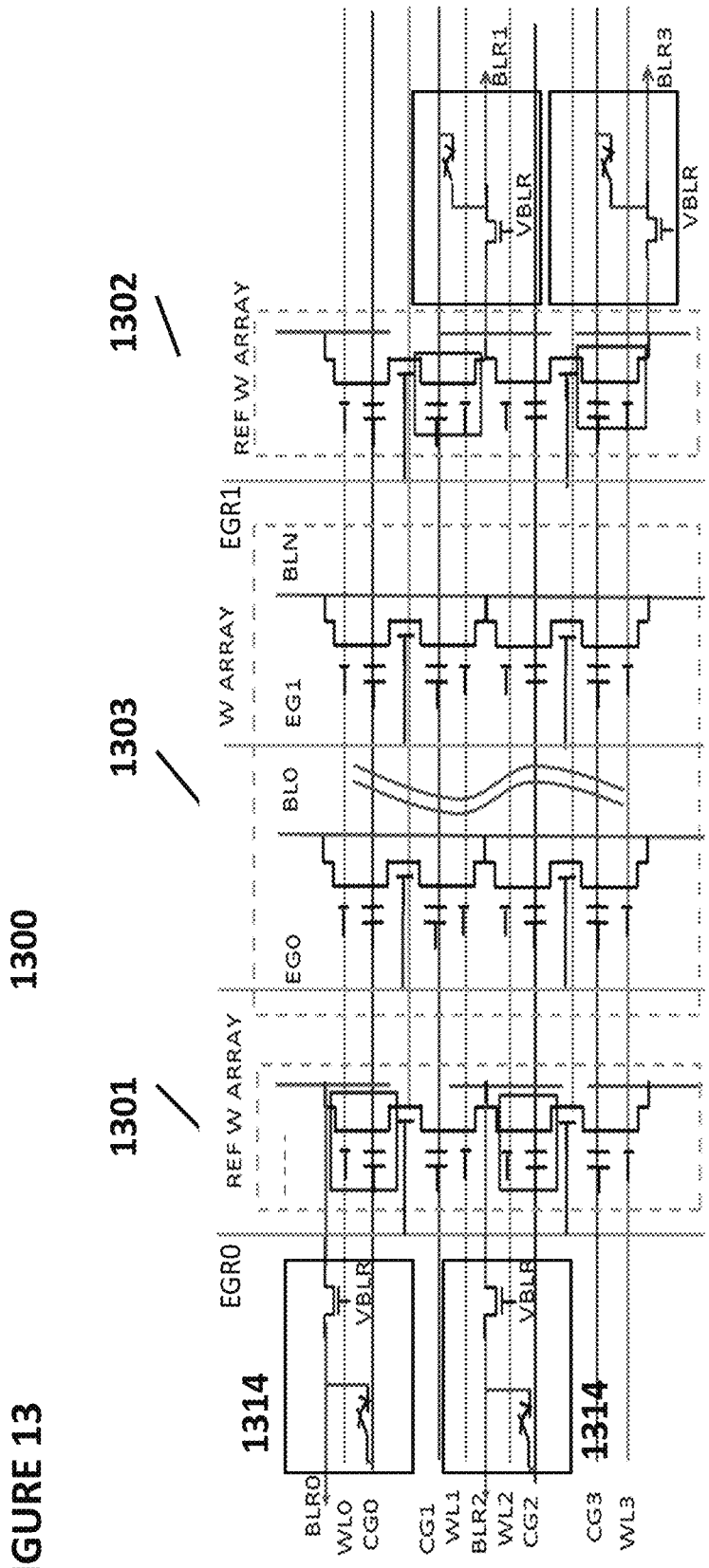
FIG. 13 depicts another embodiment of a vector multiplier matrix.

FIG. 13 depicts neuron VMM array 1300, which is particularly suited for memory cells 310 as shown in FIG. 3, and is utilized as the synapses and parts of neurons between an input layer and the next layer. VMM array 1300 comprises a memory array 1303 of non-volatile memory cells, reference array 1301 or first non-volatile reference memory cells, and reference array 1302 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1300 is similar to VMM array 1400, except that VMM array 1300 implements bi-directional tuning, where each individual cell can be completely erased, partially programmed, and partially erased as needed to reach the desired amount of charge on the floating gate due to the use of separate EG lines. As shown, reference arrays 1301 and 1302 convert input current in the terminal BLR0, BLR1, BLR2, and BLR3 into control gate voltages CG0, CG1, CG2, and CG3 (through the action of diode-connected reference cells through multiplexors 1314) to be applied to the memory cells in the row direction. The current output (neuron) is in the bitlines BL0-BLN, where each bit line sums all currents from the non-volatile memory cells connected to that particular bitline.

Table No. 8 depicts operating voltages for VMM array 1300. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

the output vector (hidden state) $h_1$ from cell 1402, and cell state $c_1$ from cell 1402 and generates output vector $h_2$ and cell state vector $c_2$. Cell 1404 receives input vector $x_3$, the output vector (hidden state) $h_2$ from cell 1403, and cell state $c_2$ from cell 1403 and generates output vector $h_3$. Additional cells can be used, and an LSTM with four cells is merely an example.

Figure 14:
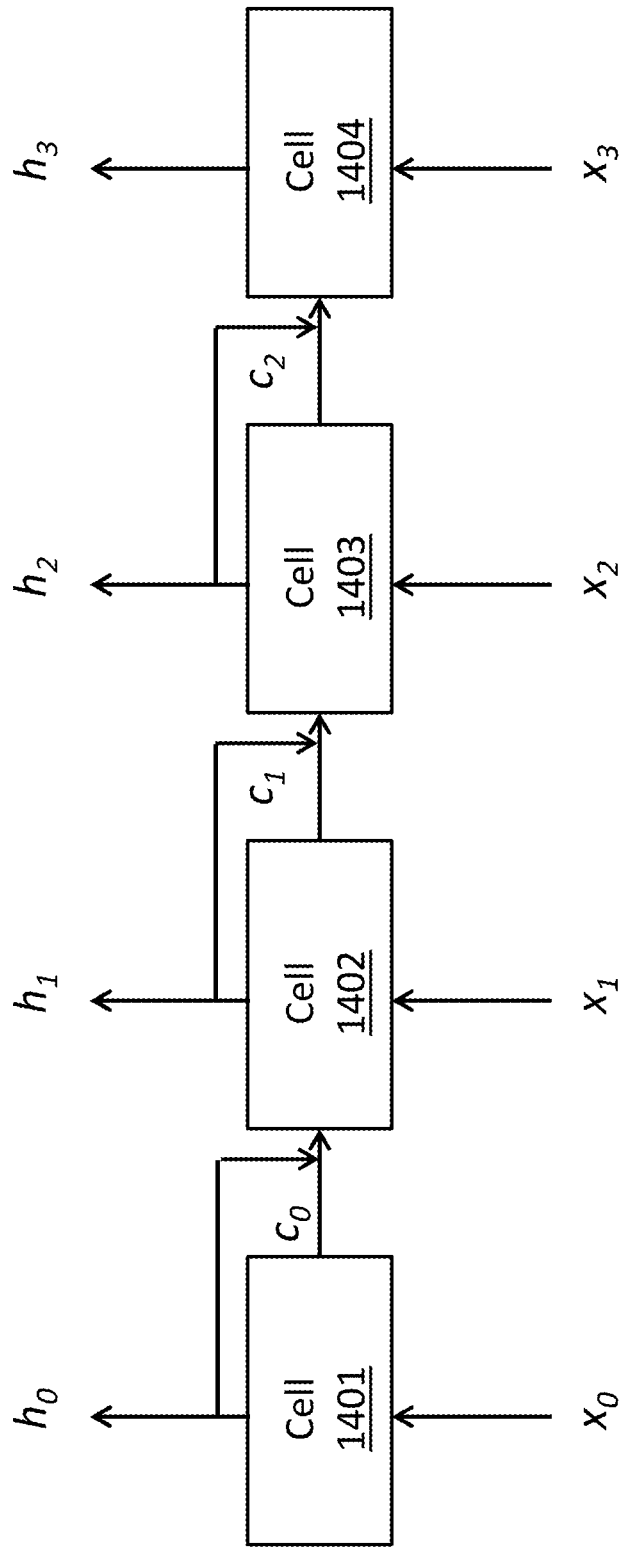
FIG. 14 depicts a prior art long short term memory system.
Figure 15:
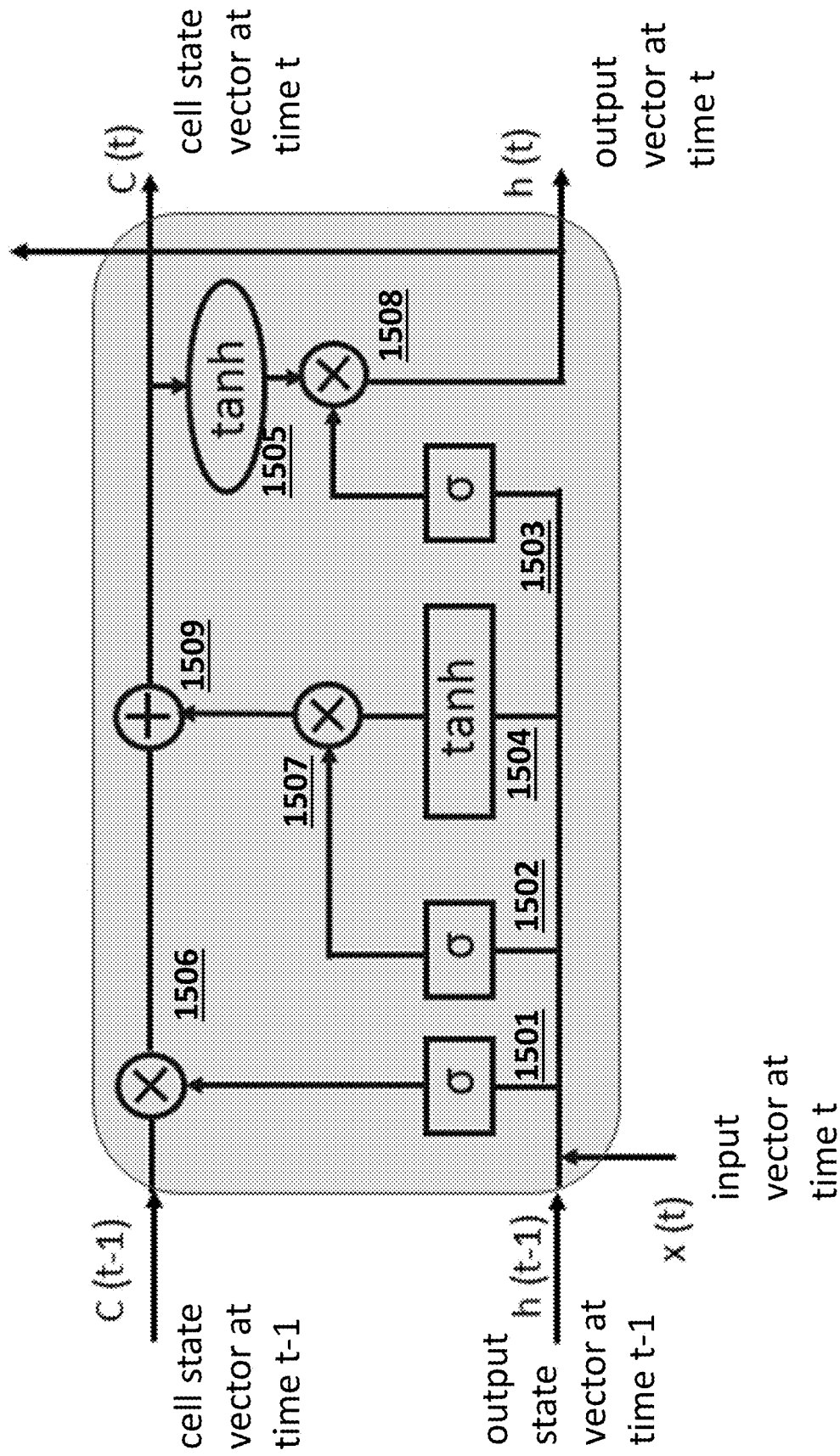
FIG. 15 depicts an exemplary cell in a prior art long short term memory system.

FIG. 15 depicts an exemplary implementation of an LSTM cell 1500, which can be used for cells 1401, 1402, 1403, and 1404 in FIG. 14. LSTM cell 1500 receives input vector x(t), cell state vector c(t−1) from a preceding cell, and output vector h(t−1) from a preceding cell, and generates cell state vector c(t) and output vector h(t).

LSTM cell 1500 comprises sigmoid function devices 1501, 1502, and 1503, each of which applies a number between 0 and 1 to control how much of each component in the input vector is allowed through to the output vector. LSTM cell 1500 also comprises tan h devices 1504 and 1505 to apply a hyperbolic tangent function to an input vector, multiplier devices 1506, 1507, and 1508 to multiply two vectors together, and addition device 1509 to add two vectors together. Output vector h(t) can be provided to the next LSTM cell in the system, or it can be accessed for other purposes.

Figure 16:
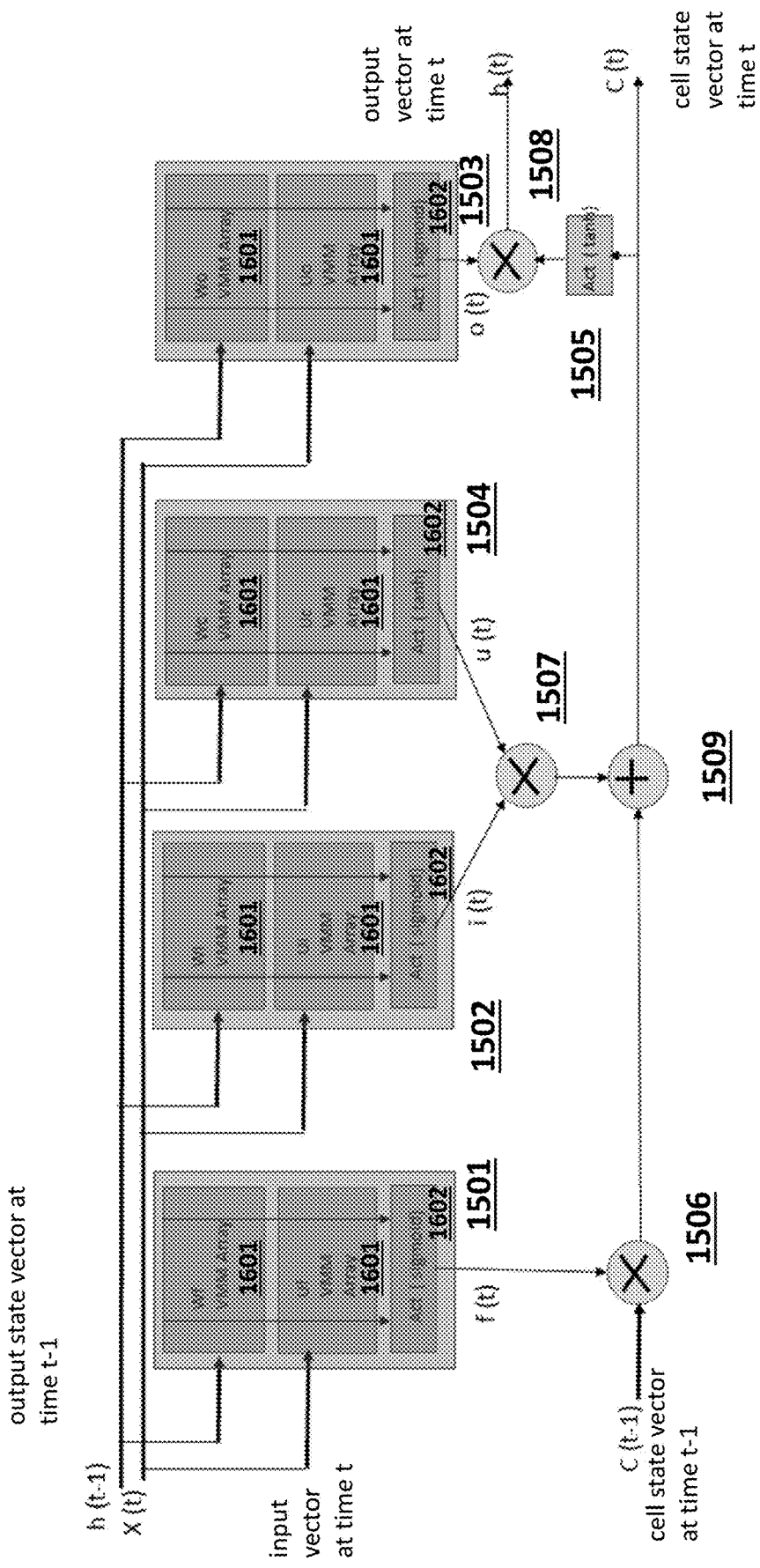
FIG. 16 depicts an implementation of the exemplary cell in a long short term memory system of FIG. 15.

FIG. 16 depicts an LSTM cell 1600, which is an example of an implementation of LSTM cell 1500. For the reader's convenience, the same numbering from LSTM cell 1500 is used in LSTM cell 1600. Sigmoid function devices 1501, 1502, and 1503 and tank device 1504 each comprise multiple VMM arrays 1601 and activation circuit blocks 1602. Thus, it can be seen that VMM arrays are particular useful in LSTM cells used in certain neural network systems.

Figure 17:
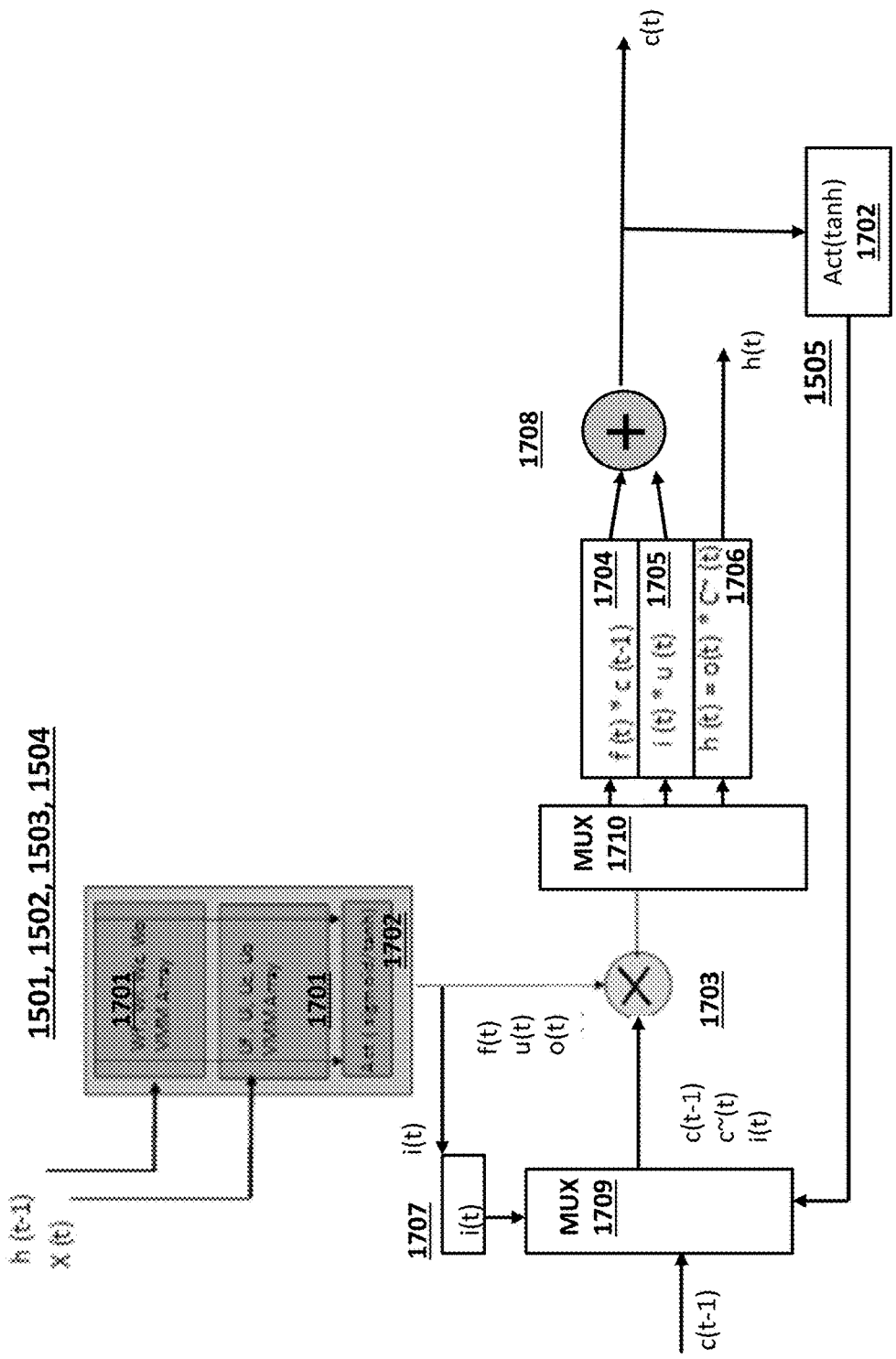
FIG. 17 depicts another implementation of the exemplary cell in a long short term memory system of FIG. 15.

An alternative to LSTM cell 1600 (and another example of an implementation of LSTM cell 1500) is shown in FIG. 17. In FIG. 17, sigmoid function devices 1501, 1502, and

TABLE NO. 8

| | | | | | | CG-unsel | | | | |
|---|---|---|---|---|---|---|---|---|---|---|
| | | WL- | | BL- | | same | CG- | | EG- | | SL- |
| | WL | unsel | BL | unsel | CG | sector | unsel | EG | unsel | SL | unsel |
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Long Short-Term Memory

The prior art includes a concept known as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

FIG. 14 depicts an exemplary LSTM 1400. LSTM 1400 in this example comprises cells 1401, 1402, 1403, and 1404. Cell 1401 receives input vector $x_0$ and generates output vector $h_0$ and cell state vector $c_0$. Cell 1402 receives input vector $x_1$, the output vector (hidden state) $h_0$ from cell 1401, and cell state $c_0$ from cell 1401 and generates output vector $h_1$ and cell state vector $c_1$. Cell 1403 receives input vector $x_2$, 1503 and tan h device 1504 share the same physical hardware (VMM arrays 1701 and activation function block 1702) in a time-multiplexed fashion. LSTM cell 1700 also comprises multiplier device 1703 to multiply two vectors together, addition device 1708 to add two vectors together, tank device 1505 (which comprises activation circuit block 1702), register 1707 to store the value i(t) when i(t) is output from sigmoid function block 1702, register 1704 to store the value f(t)*c(t−1) when that value is output from multiplier device 1703 through multiplexor 1710, register 1705 to store the value i(t)*u(t) when that value is output from multiplier device 1703 through multiplexor 1710, and register 1706 to store the value o(t)*c~(t) when that value is output from multiplier device 1703 through multiplexor 1710, and multiplexor 1709.

Whereas LSTM cell 1600 contains multiple sets of VMM arrays 1601 and respective activation function blocks 1602, LSTM cell 1700 contains only one set of VMM arrays 1701 and activation function block 1702, which are used to represent multiple layers in the embodiment of LSTM cell 1700. LSTM cell 1700 will require less space than LSTM 1600, as LSTM cell 1700 will require ¼ as much space for VMMs and activation function blocks compared to LSTM cell 1600.

It can be further appreciated that LSTM units will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry required outside of the VMM arrays themselves.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

Figure 18:
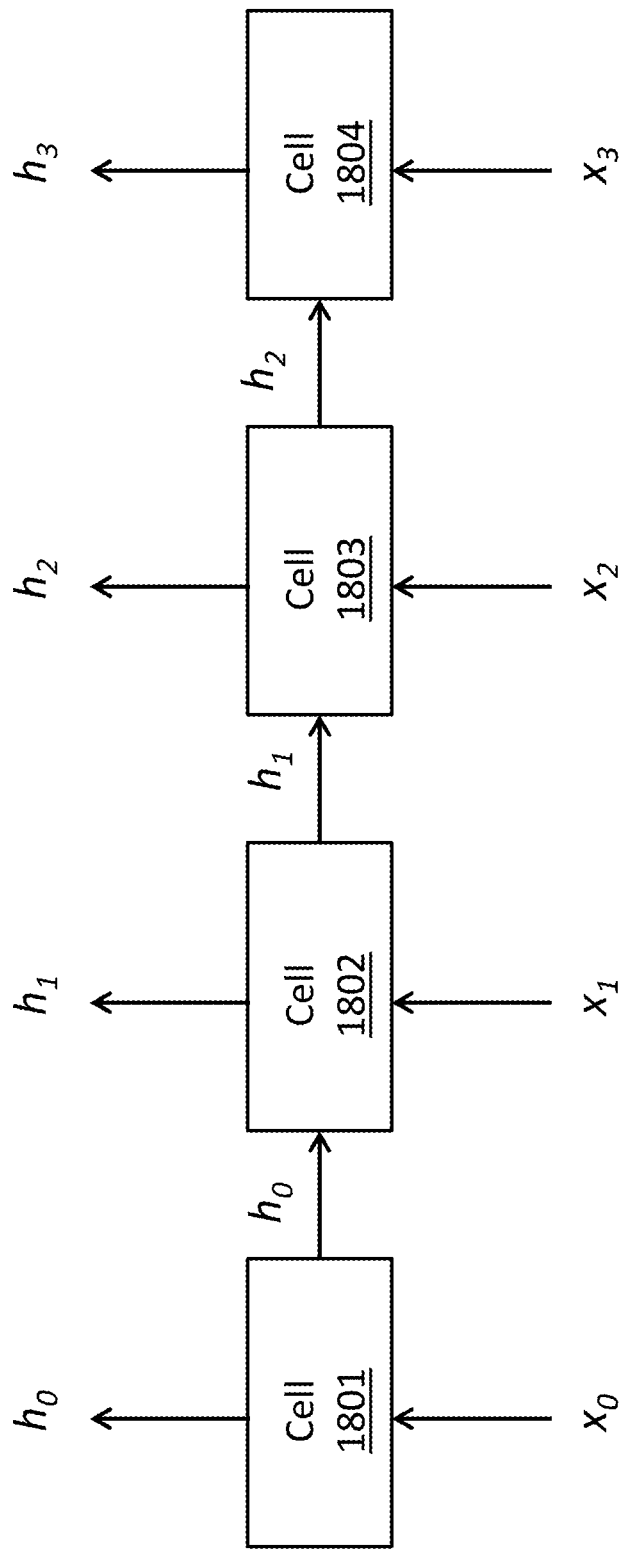
FIG. 18 depicts a prior art gated recurrent unit system.

FIG. 18 depicts an exemplary GRU 1800. GRU 1800 in this example comprises cells 1801, 1802, 1803, and 1804. Cell 1801 receives input vector $x_0$ and generates output vector $h_0$. Cell 1802 receives input vector $x_1$, the output vector $h_0$ from cell 1801 and generates output vector $h_1$. Cell 1803 receives input vector $x_2$ and the output vector (hidden state) $h_1$ from cell 1802 and generates output vector $h_2$. Cell 1804 receives input vector $x_3$ and the output vector (hidden state) $h_2$ from cell 1803 and generates output vector $h_3$. Additional cells can be used, and an GRU with four cells is merely an example.

Figure 19:
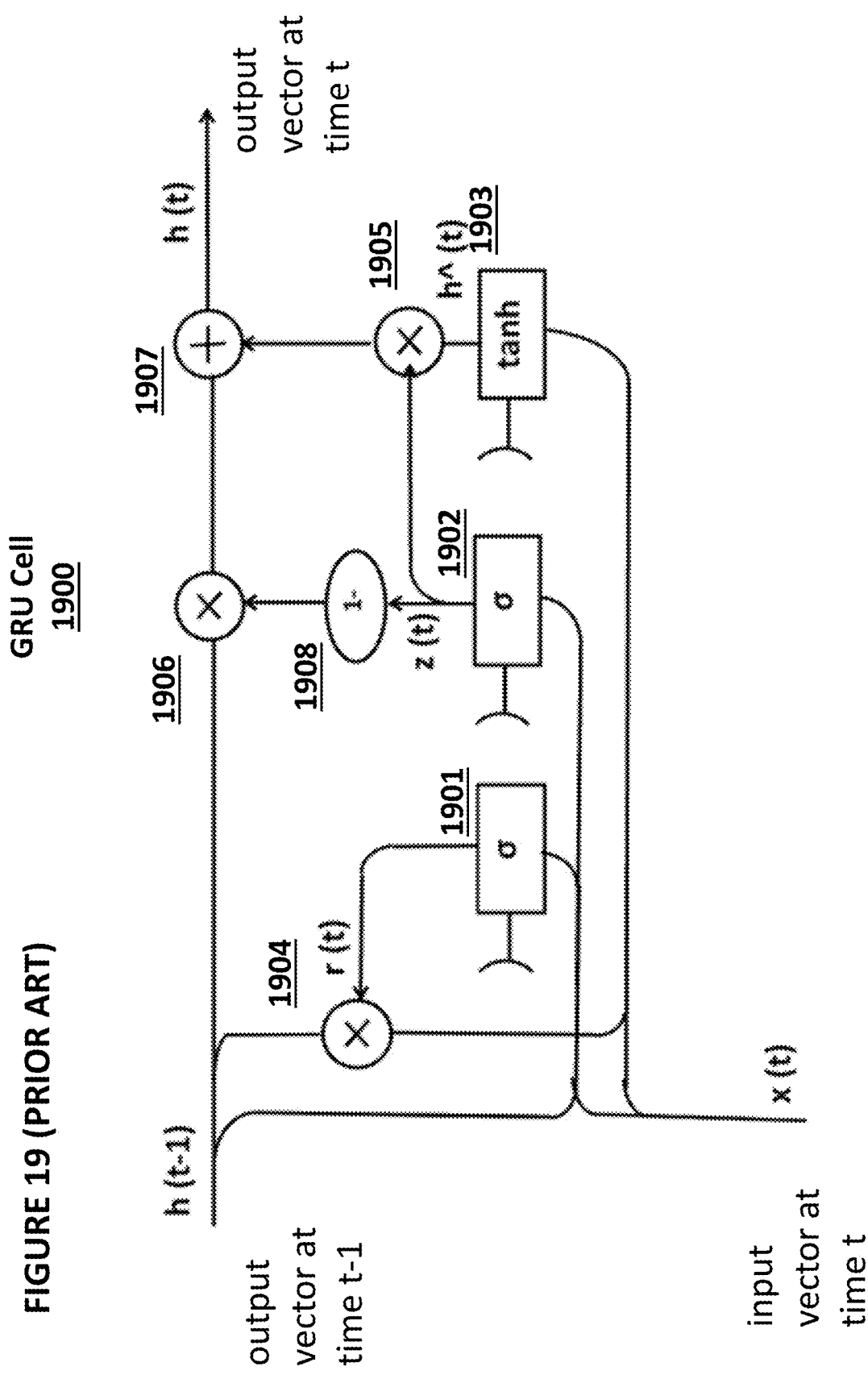
FIG. 19 depicts an exemplary cell in a prior art gated recurrent unit system.

FIG. 19 depicts an exemplary implementation of a GRU cell 1900, which can be used for cells 1801, 1802, 1803, and 1804 of FIG. 18. GRU cell 1900 receives input vector x(t) and output vector h(t−1) from a preceding GRU cell and generates output vector h(t). GRU cell 1900 comprises sigmoid function devices 1901 and 1902, each of which applies a number between 0 and 1 to components from output vector h(t−1) and input vector x(t). GRU cell 1900 also comprises a tan h device 1903 to apply a hyperbolic tangent function to an input vector, a plurality of multiplier devices 1904, 1905, and 1906 to multiply two vectors together, an addition device 1907 to add two vectors together, and a complementary device 1908 to subtract an input from 1 to generate an output.

Figure 20:
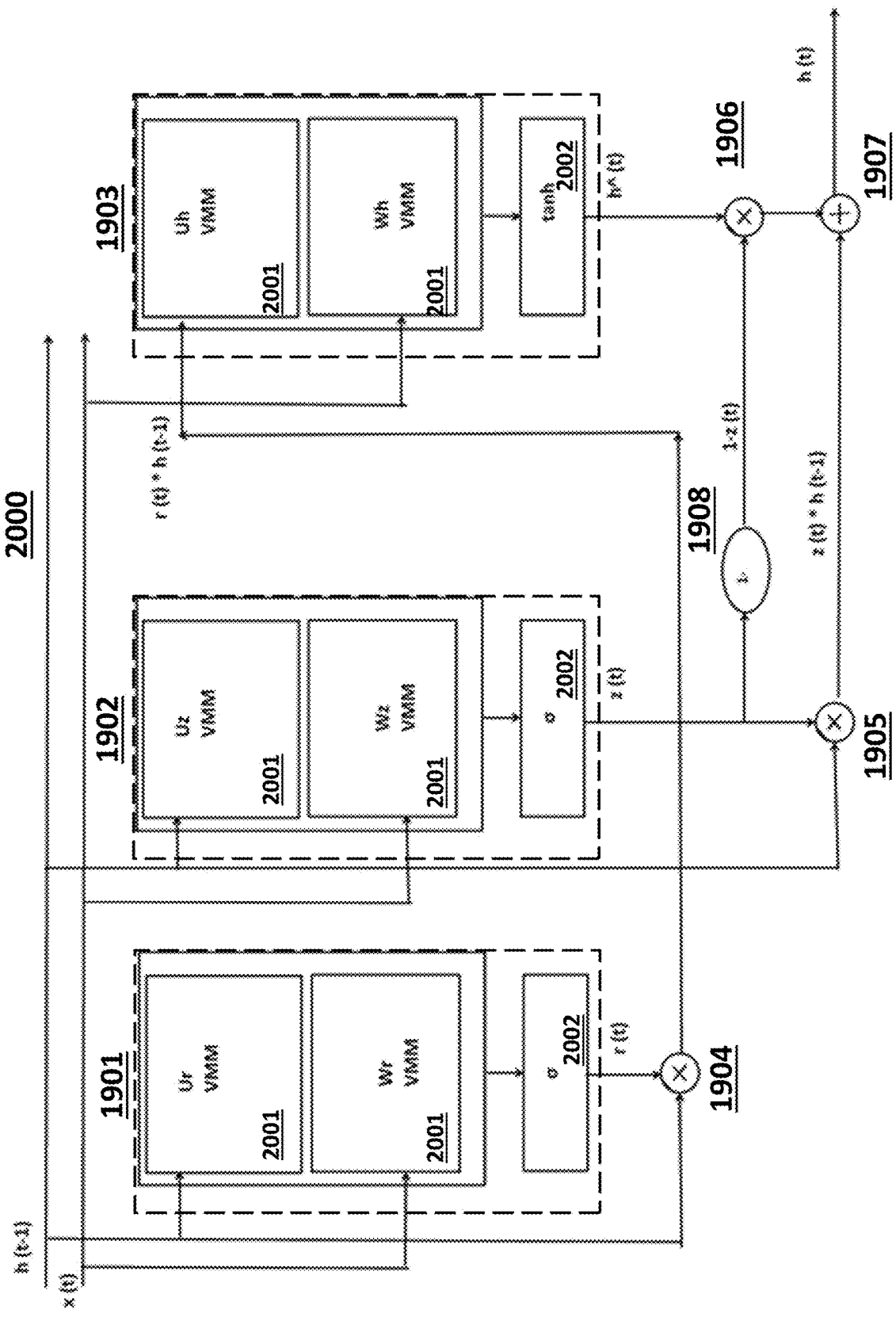
FIG. 20 depicts an implementation of the exemplary cell in the gated recurrent unit system of FIG. 19.

FIG. 20 depicts a GRU cell 2000, which is an example of an implementation of GRU cell 1900. For the reader's convenience, the same numbering from GRU cell 1900 is used in GRU cell 2000. As can be seen in FIG. 20, sigmoid function devices 1901 and 1902, and tan h device 1903 each comprise multiple VMM arrays 2001 and activation function blocks 2002. Thus, it can be seen that VMM arrays are of particular use in GRU cells used in certain neural network systems.

Figure 21:
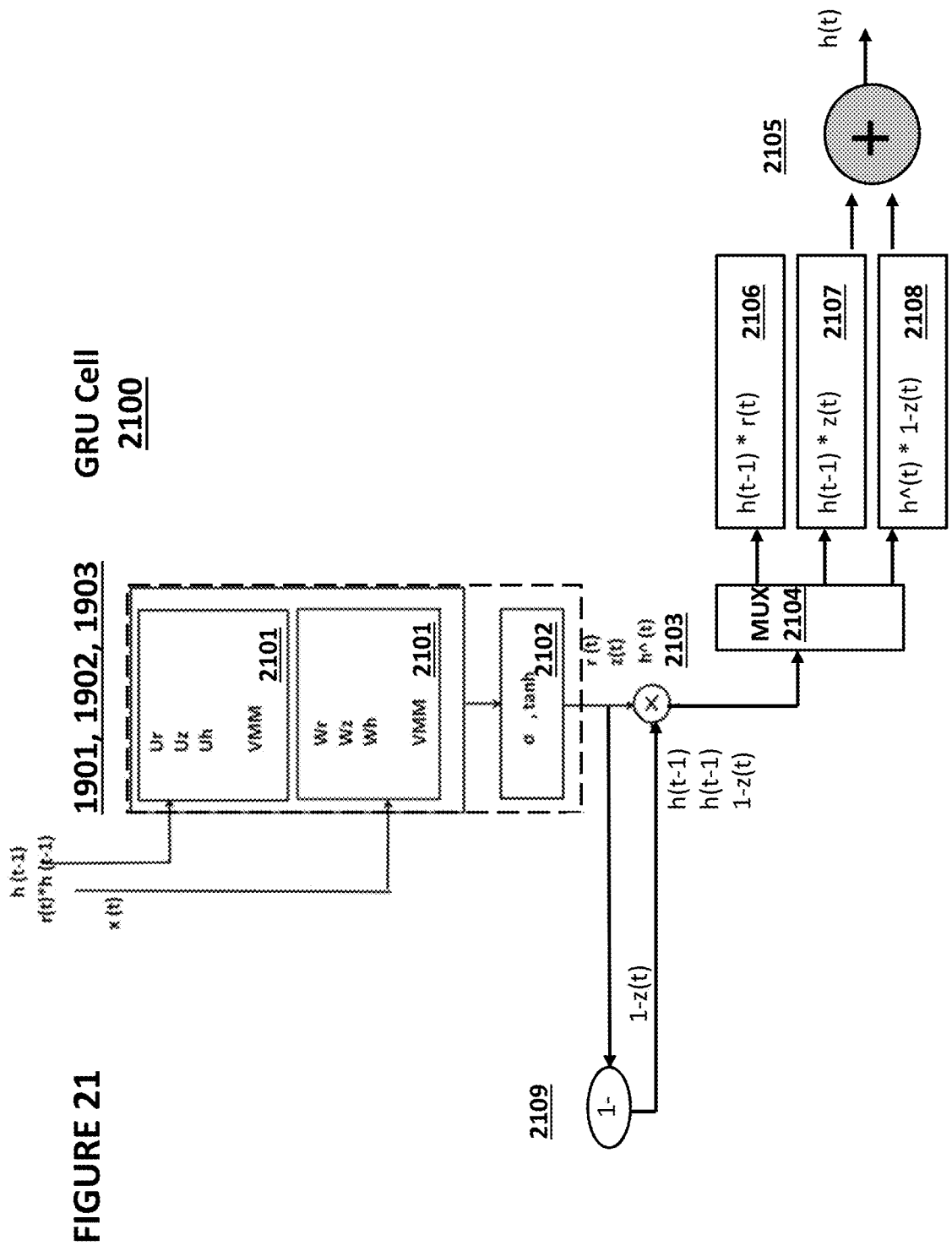
FIG. 21 depicts another embodiment of the exemplary cell in the gated recurrent unit system of FIG. 19.

An alternative to GRU cell 2000 (and another example of an implementation of GRU cell 1900) is shown in FIG. 21. In FIG. 21, GRU cell 2100 utilizes VMM arrays 2101 and activation function block 2102, which when configured as a sigmoid function applies a number between 0 and 1 to control how much of each component in the input vector is allowed through to the output vector. In FIG. 21, sigmoid function devices 1901 and 1902 and tan h device 1903 share the same physical hardware (VMM arrays 2101 and activation function block 2102) in a time-multiplexed fashion. GRU cell 2100 also comprises multiplier device 2103 to multiply two vectors together, addition device 2105 to add two vectors together, complementary device 2109 to subtract an input from 1 to generate an output, multiplexor 2104, register 2106 to hold the value h(t−1)*r(t) when that value is output from multiplier device 2103 through multiplexor 2104, register 2107 to hold the value h(t−1)*z(t) when that value is output from multiplier device 2103 through multiplexor 2104, and register 2108 to hold the value h^(t)*(1−z(t)) when that value is output from multiplier device 2103 through multiplexor 2104.

Whereas GRU cell 2000 contains multiple sets of VMM arrays 2001 and activation function blocks 2002, GRU cell 2100 contains only one set of VMM arrays 2101 and activation function block 2102, which are used to represent multiple layers in the embodiment of GRU cell 2100. MU cell 2100 will require less space than GRU cell 2000, as GRU cell 2100 will require ⅓ as much space for VMMs and activation function blocks compared to GRU cell 2000.

It can be further appreciated that GRU systems will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry required outside of the VMM arrays themselves.

The input to the VMM arrays can be an analog level, a binary level, or digital bits (in this case a DAC is needed to convert digital bits to appropriate input analog level) and the output can be an analog level, a binary level, or digital bits (in this case an output ADC is needed to convert output analog level into digital bits).

For each memory cell in a VMM array, each weight w can be implemented by a single memory cell or by a differential cell or by two blend memory cells (average of 2 cells). In the differential cell case, two memory cells are needed to implement a weight w as a differential weight (w=w+−w−). In the two blend memory cells, two memory cells are needed to implement a weight w as an average of two cells.

Operating Temperature and Current-Voltage Characteristics of a Device

Figure 22:
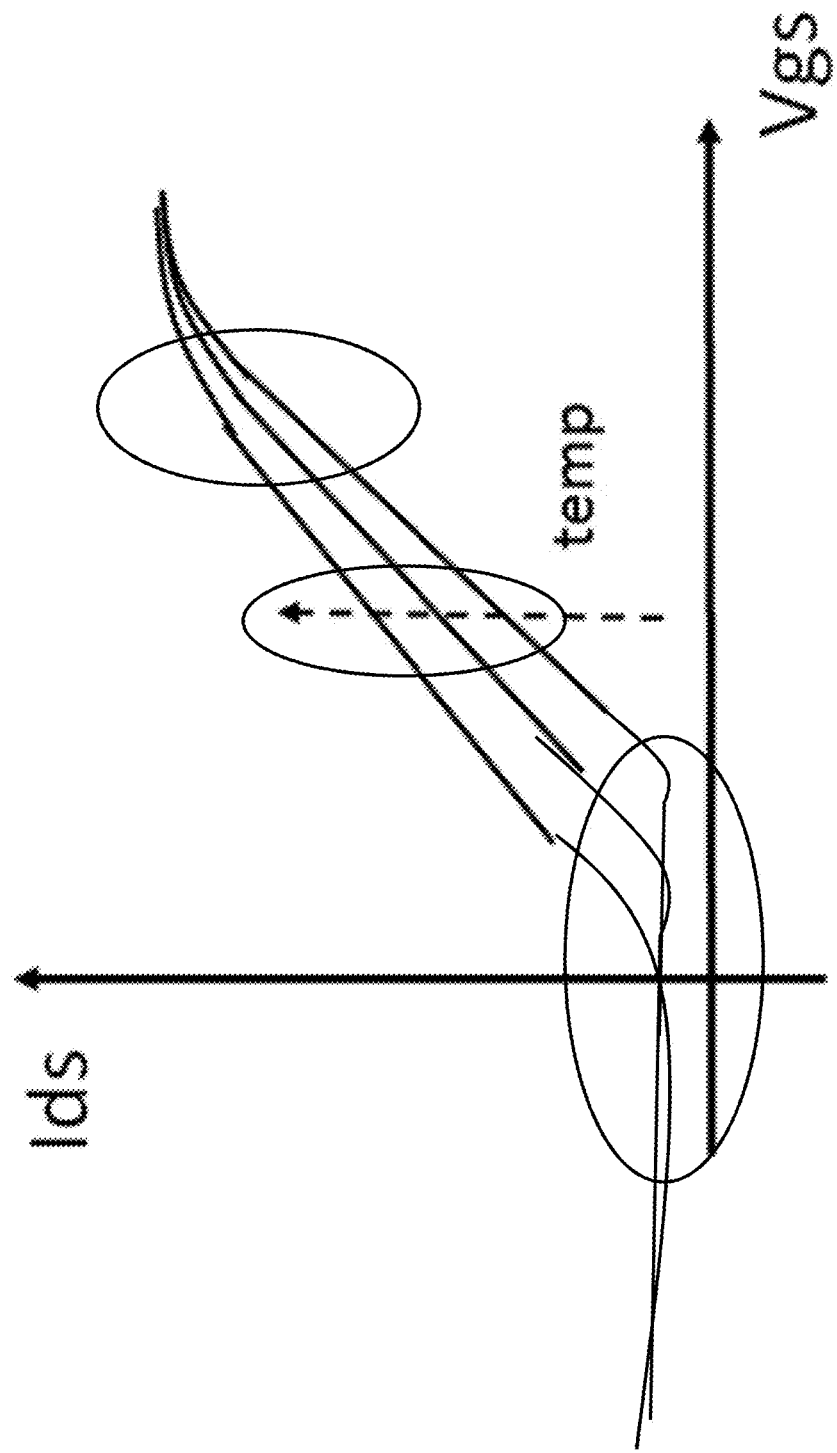
FIG. 22 depicts a graph showing an example of how a device's current-voltage characteristic curve changes as the operating temperature of the device changes.

FIG. 22 depicts a graph showing three exemplary current-voltage characteristic curves of an exemplary transistor or memory cell. It can be appreciated that the phenomena illustrated in FIG. 22 shows the behavior of typical reference transistors, reference memory cells, and selected memory cells in a flash memory system. Each curve shows how the current through the device, ids, changes as the voltage between the gate and source, Vgs, changes. Each curve represents current-voltage characteristic of the device at a certain operating temperature. Thus, it can be seem that as the operating temperature of a device changes, the corresponding Ids value for the same Vgs value changes. This variation in device characteristic as temperature changes is problematic, as analog neuromorphic memory systems require increased precision and accuracy compared to normal flash memory systems.

The embodiments described herein compensate for changes in the behavior of a device as the operating temperature of the device changes by providing slope compensation (either discrete or continuous) for its current-voltage characteristic curve, absolute scaling (normalization), and leakage reduction.

Figure 23:
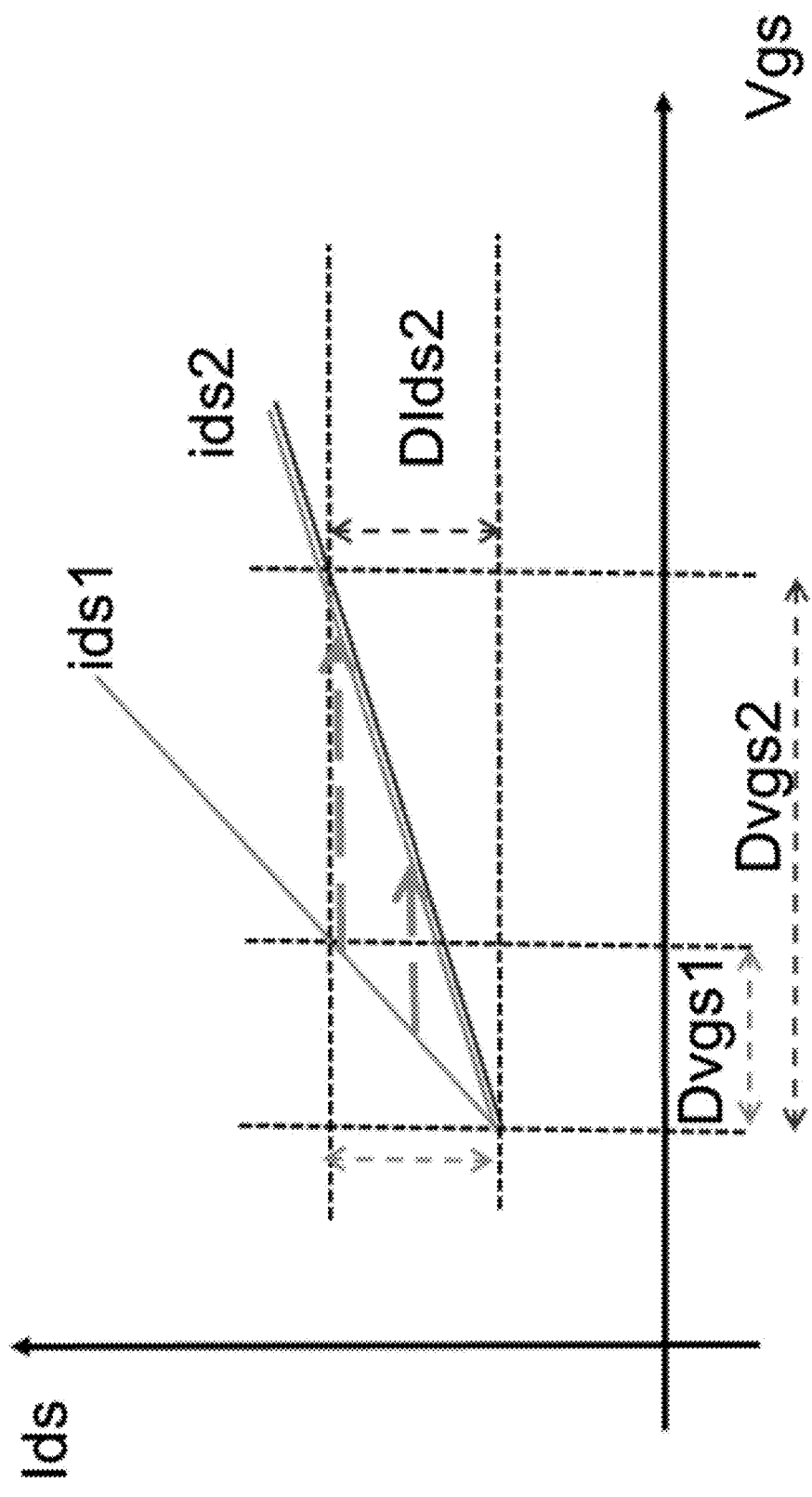
FIG. 23 depicts a graph showing an example of temperature compensation to adjust the slope of the device's current-voltage characteristic curve.

FIG. 23 depicts an example of slope compensation applied to a device's current-voltage characteristic to compensation for changes in temperature. It can be appreciated that the same device will have different sub-threshold current-voltage characteristic curves at different temperatures.

More generally, it can be appreciated that by introducing a variable, a, which changes as a function of temperature, one can apply slope compensation to a device based on the following formula:

$Ids=Ids0*\exp(a*Vgs1-Vt)/(k*Vt)$, where $Vt$ is thermal voltage.

Figure 24A:
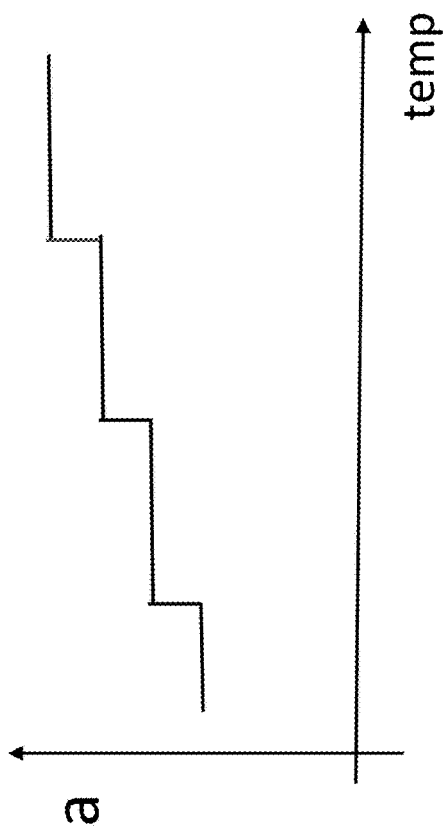
FIGS. 24A, 24B, and 24C depict an embodiment of a discrete temperature compensation system.
Figure 24C:
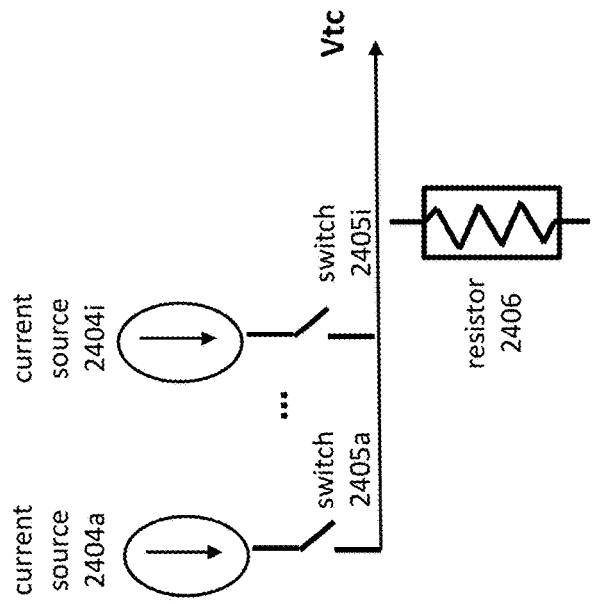
Figure 24B:
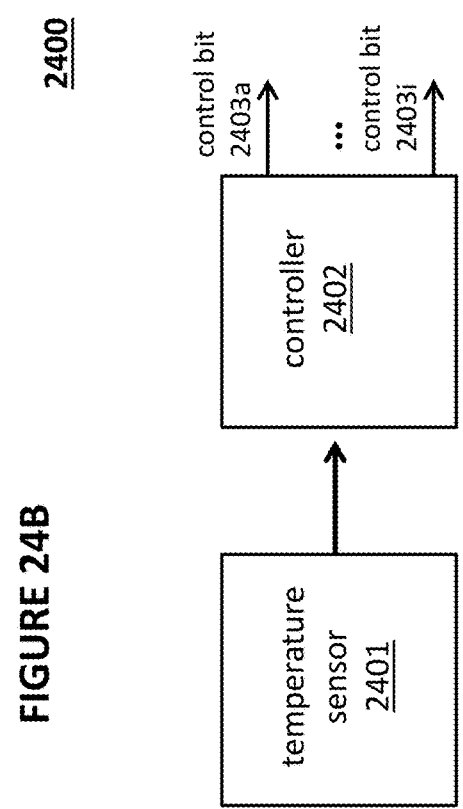

FIGS. 24A, 24B, and 24C depict discrete temperature compensation. FIG. 24A depicts exemplary values for a as a function of temperature. It can be seen that as temperature increases, a will increase in discrete steps. Alternatively an equivalent scaling constant will decrease in discreet step versus temperature such as for a memory cell working in linear or saturation region. FIG. 24B depicts an exemplary temperature compensation block 2400. Temperature sensor 2401 measures the temperature of a device. The output of temperature sensor 2401 is then provided to controller 2402 (which can be discrete logic or a microcontroller running software), which generates control bits 2403a, . . . , 2403i, where the range a to i represents and exemplary number of discrete levels for k. It will be appreciated that a larger range or smaller range can be used. Each of the control bits 2403 is asserted during a certain temperature range assigned to that control bit. Thus, as temperature increases, a different control bit 2403 will be asserted as each discrete level of temperature is reached. The control bits 2403 are then applied to switches 2405 (which also number from 2405a, . . . , 2405i) in FIG. 24C, which depicts a temperature compensation bias voltage generation circuit. Each switch 2405, when closed, applies current source 2404 (which also number from 2404a, . . . , 2404i) to one end of resistor 2406. Here, each current source 2404 generates a different amount of current than the current source 2404 that was activated by a switch at the preceding temperature range. As a result, the voltage at that node, Vtc, changes as temperature increases. Vtc is a temperature compensation bias voltage that can be applied to the gate of a transistor, the word line of a memory cell of the type shown in FIG. 2 as memory cell 210, the control gate of a memory cell of the type shown in FIG. 3 as memory cell 310, the source gate of a memory cell of the type shown in FIG. 4 as memory cell 410, or the control gate of a memory cell of the type shown in FIG. 5 as memory cell 510. By adding Vtc in that manner, the voltage characteristic curve for the device will be modified because each gate voltage value essentially will be shifted by an amount Vtc.

Figure 25:
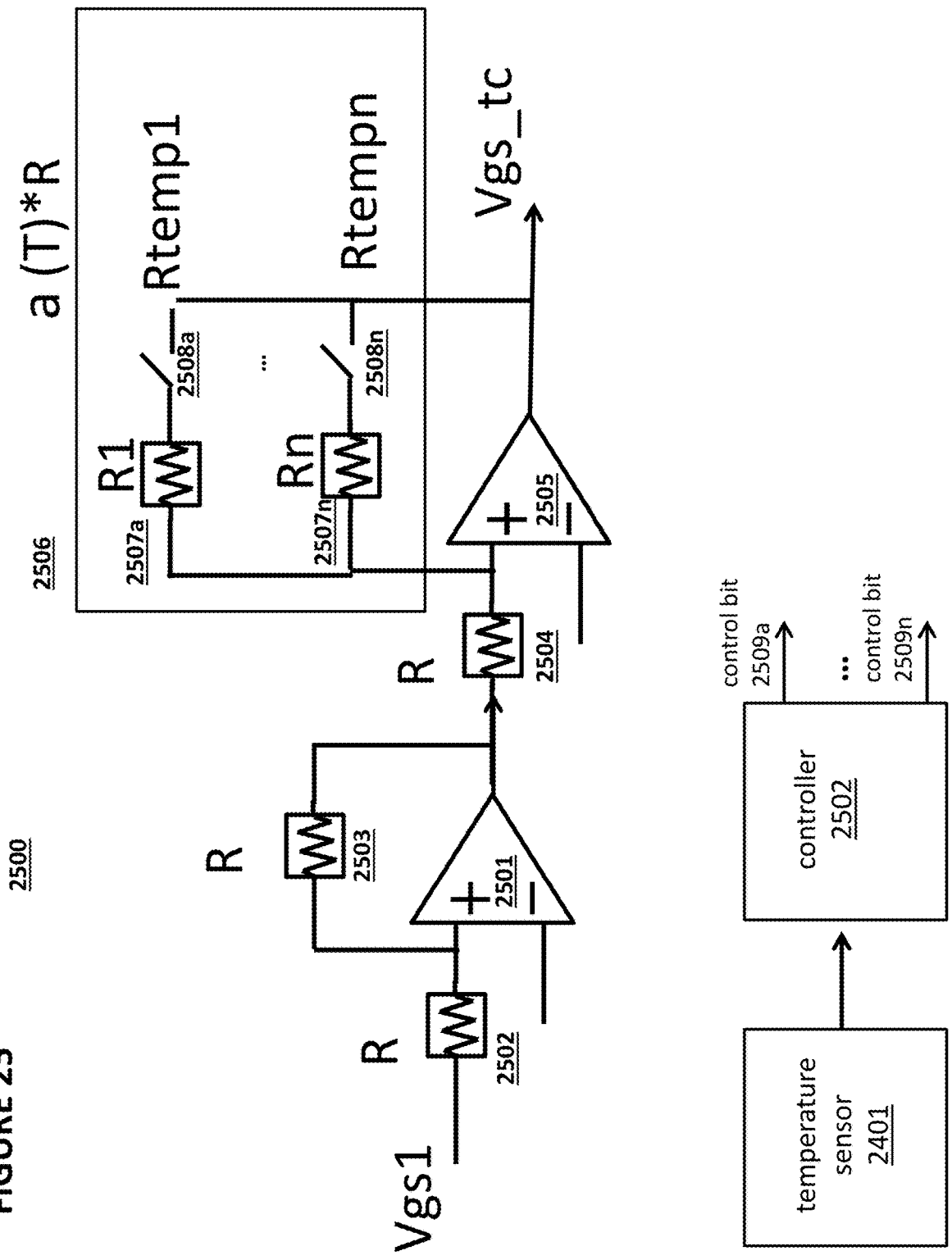
FIG. 25 depicts an embodiment of a discrete temperature compensation system.

FIG. 25 depicts temperature compensation block 2500. Temperature compensation block 2500 comprises operational amplifiers 2501 and 2505; adjustable resistor block 2506; temperature sensor 2401, and controller 2502. Adjustable resistor block 2506 comprises resistors 2507a, . . . , 2507n, each coupled to one of switches 2508a, . . . , 2508n As in FIG. 24, temperature sensor 2401 measures the temperature of a device. The output of temperature sensor 2401 is then provided to controller 2502 (which can be discrete logic or a microcontroller running software), which generates control bits 2509a, . . . , 2509n, where the range a to n represents an exemplary number of discrete levels for a. It will be appreciated that a larger range or smaller range can be used. A different control bit among control bits 2509a, . . . , 2509n is asserted depending on the temperature sensed by temperature sensor 2401. The control bits 2509 are then applied to switches 2508 (which also number from 2508a, . . . , 2508n). Each switch 2508, when closed, applies respective resistor 2507 (which also number from 2507a, . . . , 2507n) as a feedback resistor to operational amplifier 2505. As a result, the output voltage of operational amplifier 2505, Vgs_tc, increases as temperature increases.

Vgs_tc is a temperature compensation bias voltage that can be applied to the gate of a transistor, the word line of a memory cell of the type shown in FIGS. 2/3/4 as memory cell 210/310/410, the control gate of a memory cell of the type shown in FIGS. 3/5 as memory cell 310/510, the source gate of a memory cell of the type shown in FIGS. 2/3/4/5 as memory cell 210/310/410/510, or the control gate of a memory cell of the type shown in FIGS. 3/5 as memory cell 310/510. By modifying Vgs_tc in this manner, the voltage characteristic curve for the device will be modified because each Vgs value essentially will be shifted by an amount Vgs_tc.

Figure 26B:
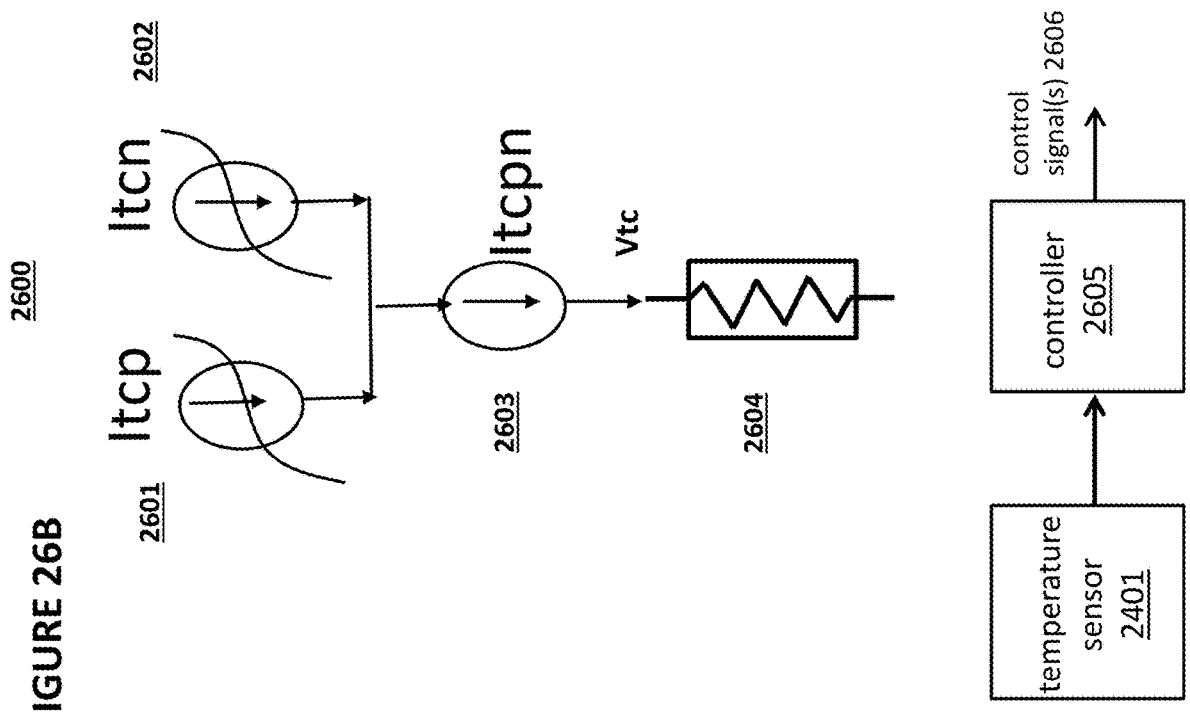
FIGS. 26A and 26B depict an example of temperature compensation using one or more adjustable current sources.
Figure 26A:
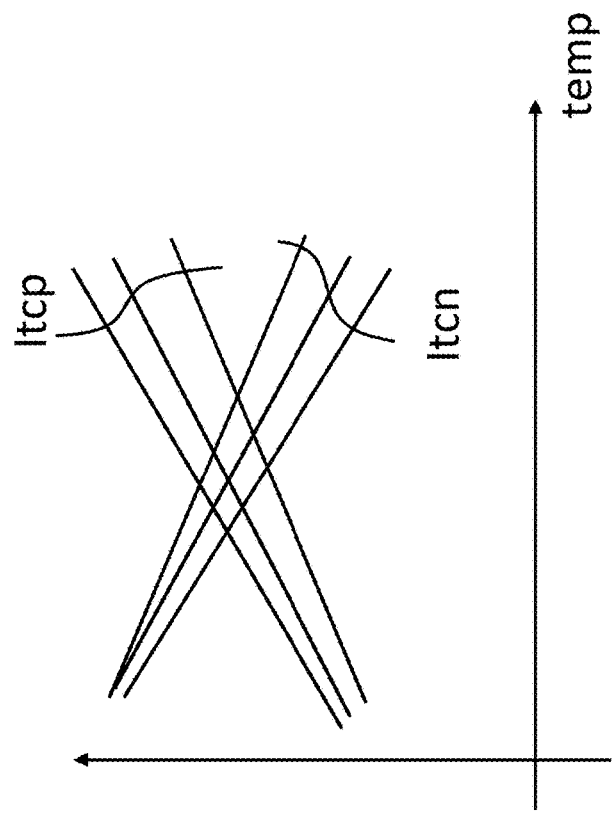

FIGS. 26A and 26B depict an embodiment for adjusting a current-voltage characteristic curve for a device by adding a compensation current, itcpn, itcp for positive temperature compensation current, itcn for negative temperature compensation current. FIG. 26A shows three (could be more than three) exemplary curves for complementary devices as temperature of each type of device changes. By injecting compensation current itcpn, the slope of the current-voltage characteristic curve for the device can be modified.

FIG. 26B shows an embodiment of temperature compensation block 2600. Temperature compensation block 2600 comprises temperature sensor 2401, which measures the temperature of a device, and controller 2605 (which can be logic or a microcontroller running software). Controller 2605 generates one or more control signals 2606.

Temperature compensation block 2600 further comprises adjustable current sources 2601 Itcp and 2602 Itcn, which together generate current represented by current source 2603, which provides compensation current itcpn. Adjustable current sources 2601 and 2602 are adjusted by control signals 2606. One or both of adjustable current sources 2601 and 2602 can be adjusted as the temperature of a device changes by control signals 2606, to change the amount of compensation current, itcpn, provided. The current itcpn is applied to resistor 2604, resulting in a voltage Vtc at the node between current source 2603 and resistor 2604.

Vtc is a temperature compensation bias voltage that can be applied to the gate of a transistor, the word line of a memory cell of the type shown in FIGS. 2/3/4/5 as memory cell 210/310/410/510, the control gate of a memory cell of the type shown in FIGS. 3/5 as memory cell 310/510, the source gate of a memory cell of the type shown in FIGS. 2/3/4/5 as memory cell 210/310/410/510, or the erase gate of a memory cell of the type shown in FIGS. 3/4 as memory cell 310/410. By adding Vtc in that manner, the voltage characteristic curve for the device will be modified because each Vgs value essentially will be shifted by an amount Vtc.

Figure 27A:
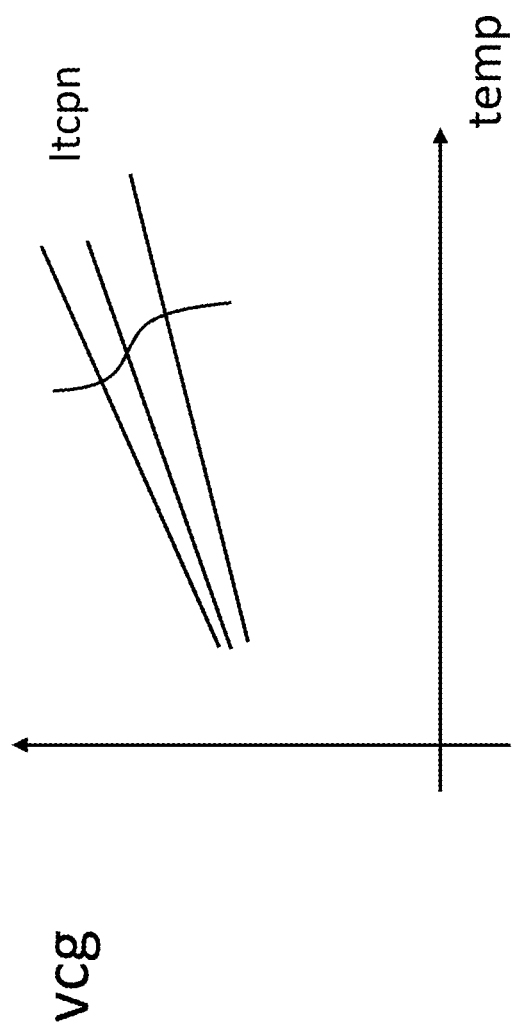
FIGS. 27A and 27B depict another embodiment of a continuous temperature compensation system that applies a bias voltage to the control gate of a flash memory device.
Figure 27B:
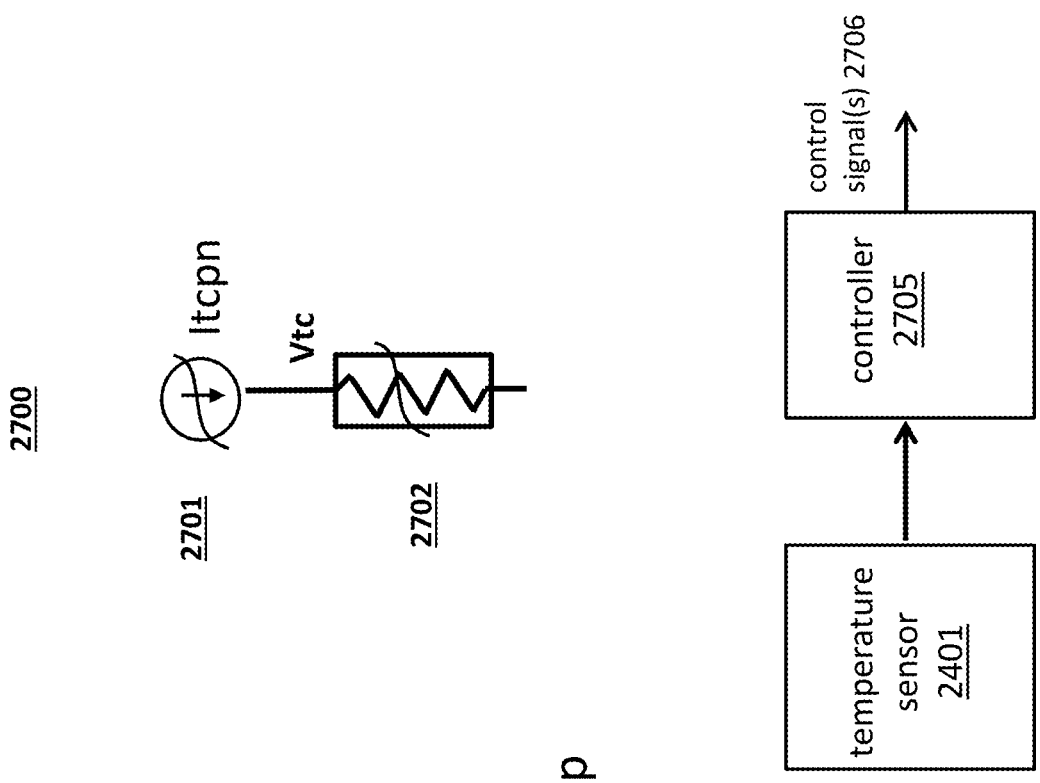

FIGS. 27A and 27B depict an embodiment for adjusting the current-voltage characteristic curve for a device by adding a bias voltage generated by a current, itcpn, on the control gate of the device. FIG. 27A shows three exemplary curves for the necessary control gate voltage, Vcg, needed to be applied to a control gate to perform a certain operation as the operating temperature of the device increases.

FIG. 27B shows an embodiment of temperature compensation block 2700. Temperature compensation block 2700 comprises temperature sensor 2401, which measures the temperature of a device, and controller 2705 (which can be logic or a microcontroller running software). Controller 2705 generates one or more control signals 2706.

Temperature compensation block 2700 further comprises adjustable current source 2701, which generates compensation current itcpn, and adjustable resistor 2702. Adjustable current source 2701 and adjustable resistor 2702 are adjusted by control signals 2706. A voltage Vtc is generated at the node between adjustable current source 2701 and adjustable resistor 2702.

Vtc is a temperature compensation bias voltage that can be applied to the control gate of a memory cell of the type shown in FIG. 3 as memory cell 310 or the control gate of a memory cell of the type shown in FIG. 5 as memory cell 510. By adding Vtc in that manner, the voltage characteristic curve for the device will be modified because each Vgs value essentially will be shifted by an amount Vtc.

Figure 28B:
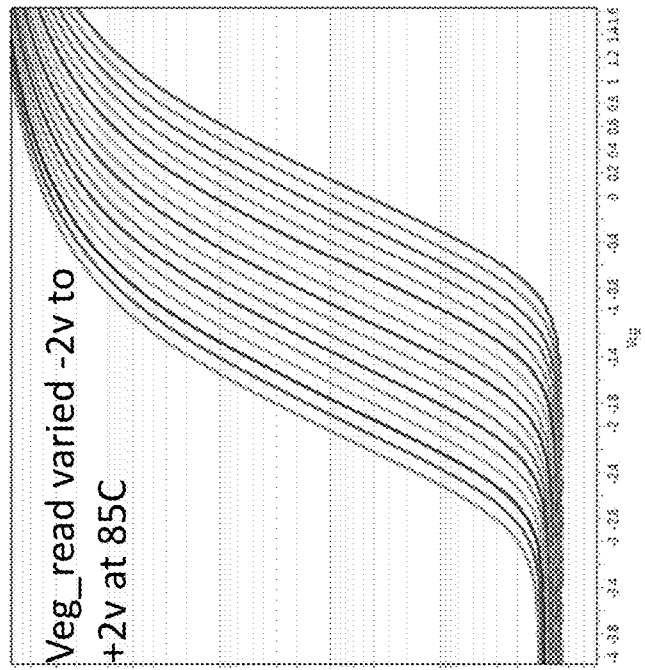
FIGS. 28A, 28B, and 28C depict another embodiment of a continuous temperature compensation system that applies a bias voltage to the erase gate of a flash memory device.
Figure 28A:
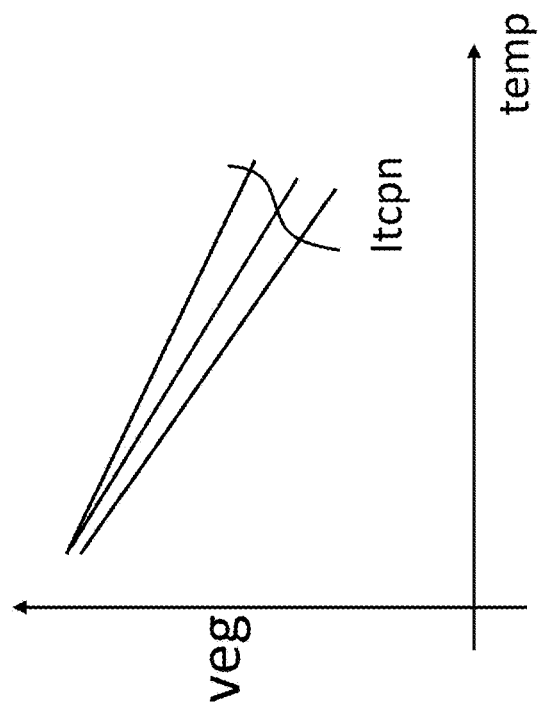

FIGS. 28A and 28B depict an embodiment for adjusting a current-voltage characteristic curve for a device by adding a bias voltage generated by a current, itcpn, on the erase gate of the device. FIG. 28A shows three exemplary curves for the necessary control gate voltage, Veg, needed to be applied to an erase gate to perform a certain operation as the operating temperature of the device increases.

FIG. 28B shows a multitude of characteristic curves, where each curve shows the Veg required for each value of Veg to perform an array read (vector matrix multiplier) operation, and each curve represents the characteristics of the device at a certain temperature or temperature range.

Figure 28C:
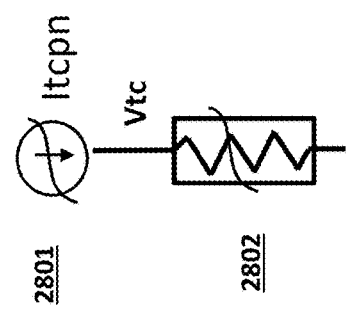

FIG. 28C shows an embodiment of temperature compensation block 2800. Temperature compensation block 2800 comprises temperature sensor 2401, which measures the temperature of a device, and controller 2805 (which can be logic or a microcontroller running software). Controller 2805 generates one or more control signals 2806.

Temperature compensation block 2800 comprises adjustable current source 2801, which generates compensation current itcpn, and adjustable resistor 2802. Adjustable current source 2801 and adjustable current resistor 2802 are adjusted by control signals 2806 as the temperature of a device changes. A voltage Vtc is generated at the node between current source 2803 and resistor 2804.

Vtc is a temperature compensation bias voltage that can be applied to the erase gate of a memory cell of the type shown in FIG. 3 as memory cell 310 or the erase gate of a memory cell of the type shown in FIG. 4 as memory cell 410. By adding Vtc in that manner, the voltage characteristic curve for the device will be modified because each Vgs value essentially will be shifted by an amount Vtc.

Figure 29B:
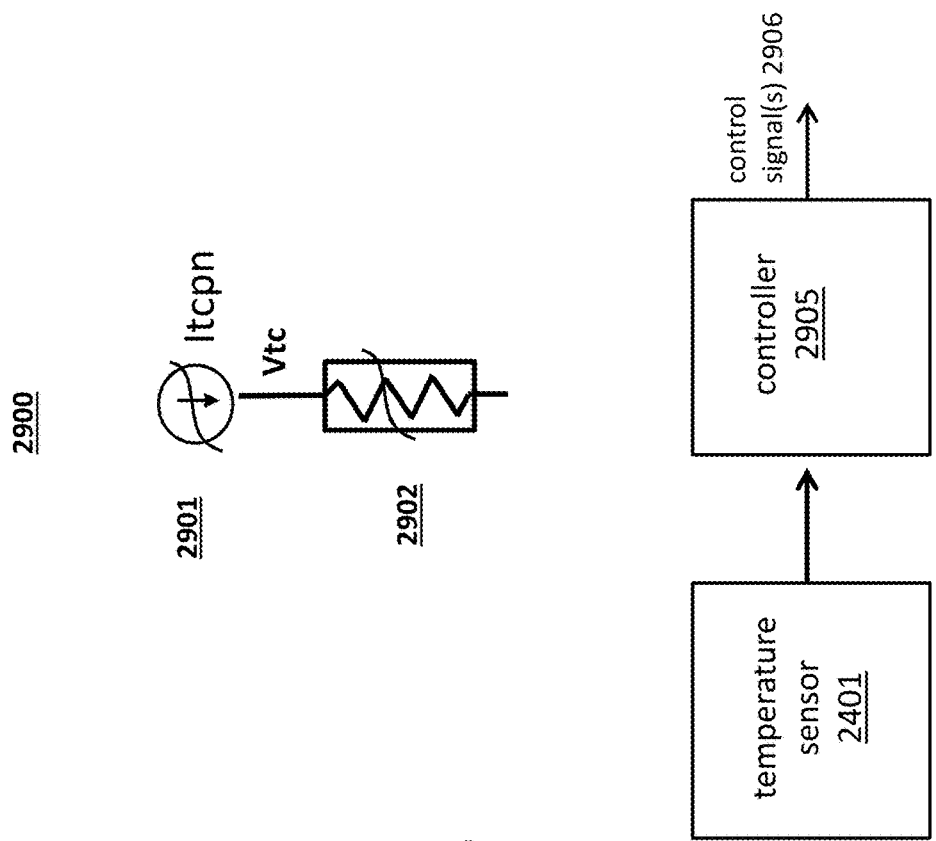
FIGS. 29A and 29B depict an embodiment of a continuous temperature compensation system that applies a bias voltage to the source line terminal of a flash memory device.
Figure 29A:
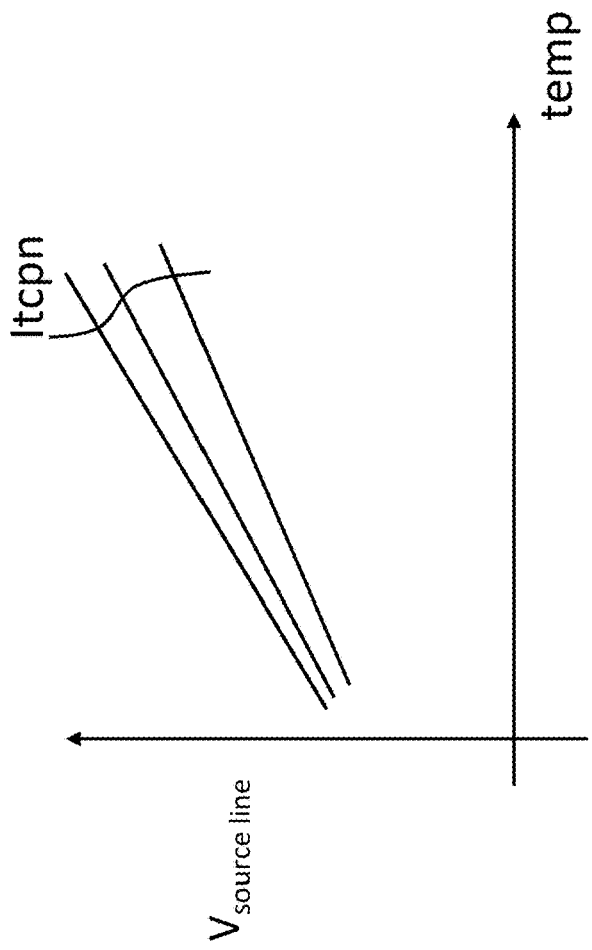

FIGS. 29A and 29B depict an embodiment for adjusting a current-voltage characteristic curve for a device by adding a bias voltage generated by a current, itcpn, on the source line terminal of the device. FIG. 29A shows three exemplary curves for the necessary source line terminal voltage needed to perform a certain operation as temperature increases.

FIG. 29B shows an embodiment of temperature compensation block 2900. Temperature compensation block 2900 comprises temperature sensor 2401, which measures the temperature of a device, and controller 2905 (which can be logic or a microcontroller running software). Controller 2905 generates one or more control signals 2906.

Temperature compensation block 2900 further comprises adjustable current source 2901, which generates compensation current itcpn, and adjustable resistor 2902. Adjustable current source 2901 and adjustable resistor 2902 can be adjusted by control signals 2906 as the temperature of a device changes, to change the amount of negative bias applied to the control gate of the device. A voltage Vtc is generated at the node between current source 2901 and resistor 2902.

Vtc is a temperature compensation bias voltage that can be applied to the source line terminal of a memory cell of the type shown in FIG. 2 as memory cell 210, the source line terminal of a memory cell of the type shown in FIG. 3 as memory cell 310, the source line terminal of a memory cell of the type shown in FIG. 4 as memory cell 410, or the erase gate of a memory cell of the type shown in FIG. 4 as memory cell 410, or the source line terminal of a memory cell of the type shown in FIG. 5 as memory cell 510. By adding Vtc in that manner, the voltage characteristic curve for the device will be modified because each Vgs value essentially will be shifted by an amount Vtc.

It can further be appreciate that differences in current-voltage characteristic curves will exist for different devices and similar devices in different configurations.

Figure 30:
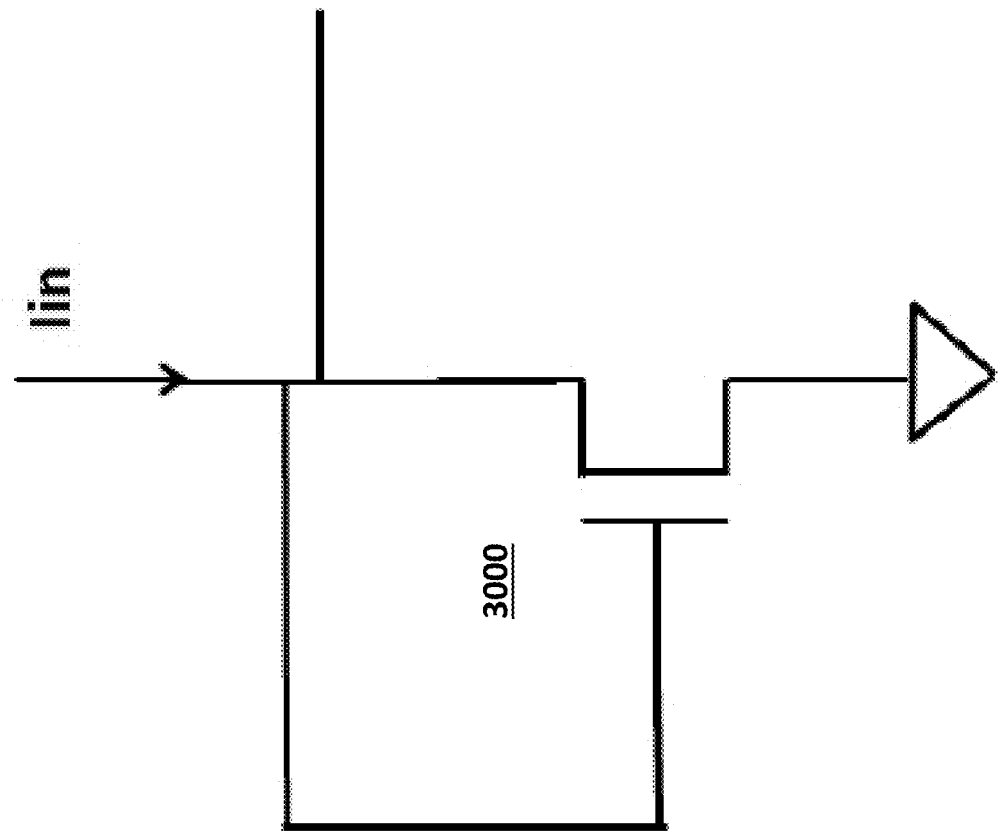
FIG. 30 depicts a transistor in a certain configuration.

FIG. 30 depicts an exemplary reference transistor 3000 with a certain configuration.

Figure 31:
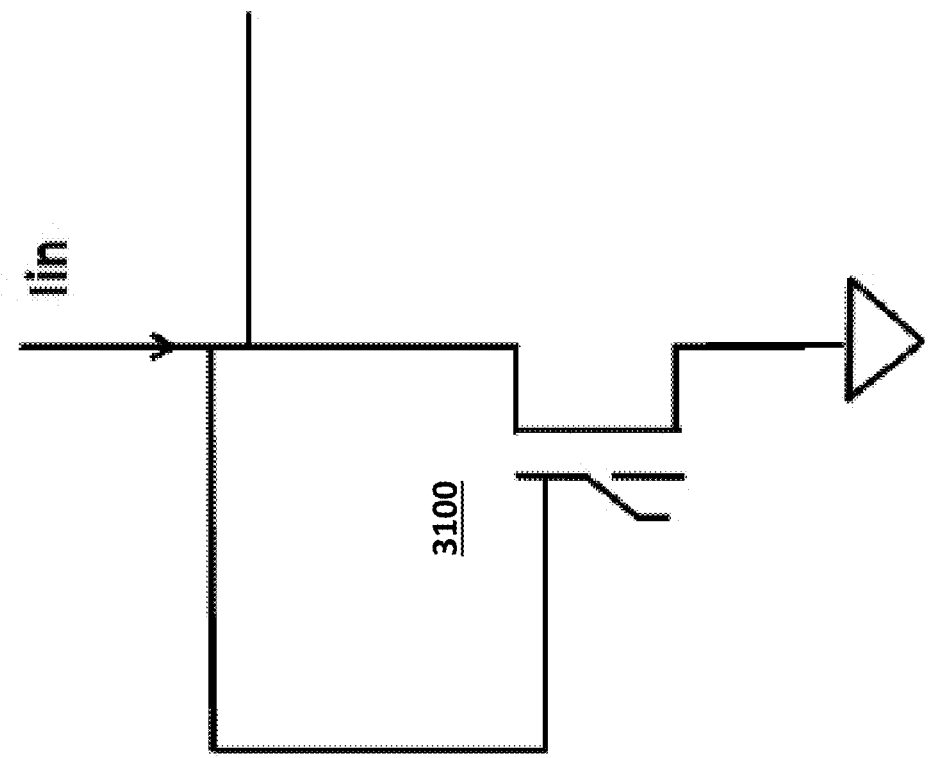
FIG. 31 depicts a memory cell in a certain configuration.

FIG. 31 depicts an exemplary reference memory cell 3100 with another configuration (wordline coupled to bitline).

Figure 32:
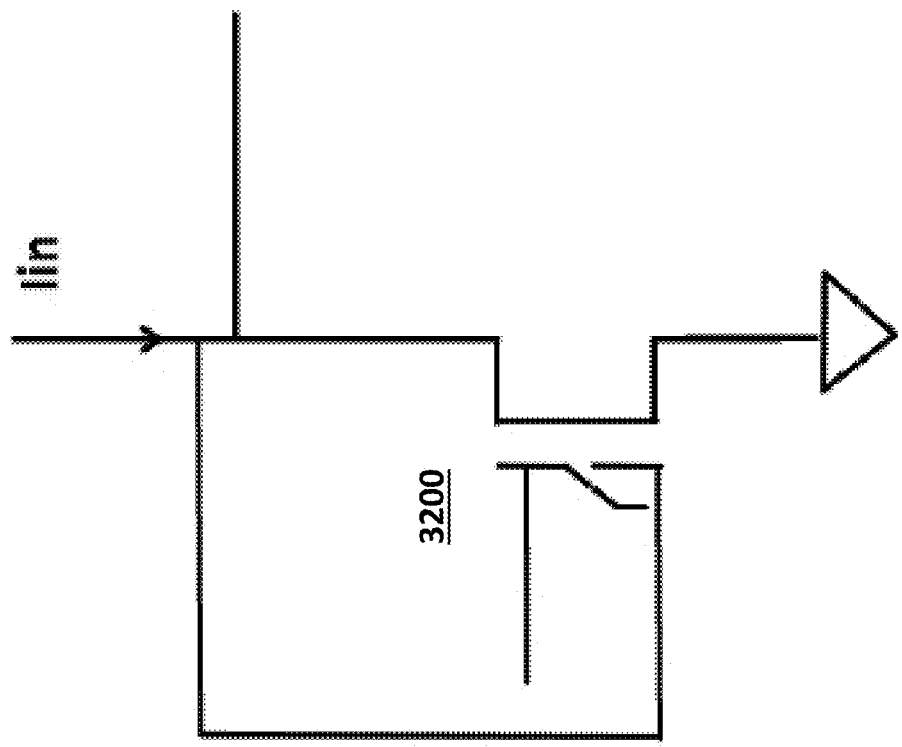
FIG. 32 depicts a memory cell in a certain configuration.

FIG. 32 depicts another exemplary reference memory cell 3200 with another configuration (floating gate FG coupled to bitline). It can be appreciated that each of these devices might have a different current-voltage characteristic curve.

The embodiments described herein compensate for the difference in slope of the current-voltage characteristic curves of reference transistors, reference memory cells, and/or selected memory cells.

In a system with two devices with different sub-threshold current-voltage characteristic curves, the drain-source current through the first device will be:

$$Ids1 = Ids0 * \exp(Vgs1 - Vt)/k1 * Ut$$

The drain-source current through the second device will be:

$$Ids2 = Ids0 * \exp(Vgs2 - Vt)/k2 * Ut$$

It can be seen that in each instance, the slope will be proportional to ~1/k.

In some of the embodiments that follow, slope normalization is implemented by using a gate-source voltage on the first device of:

$$Vgs1 = a * Vgs2$$

This will mean that Ids1 and Ids will have the same slope after slope normalization.

Figure 33:
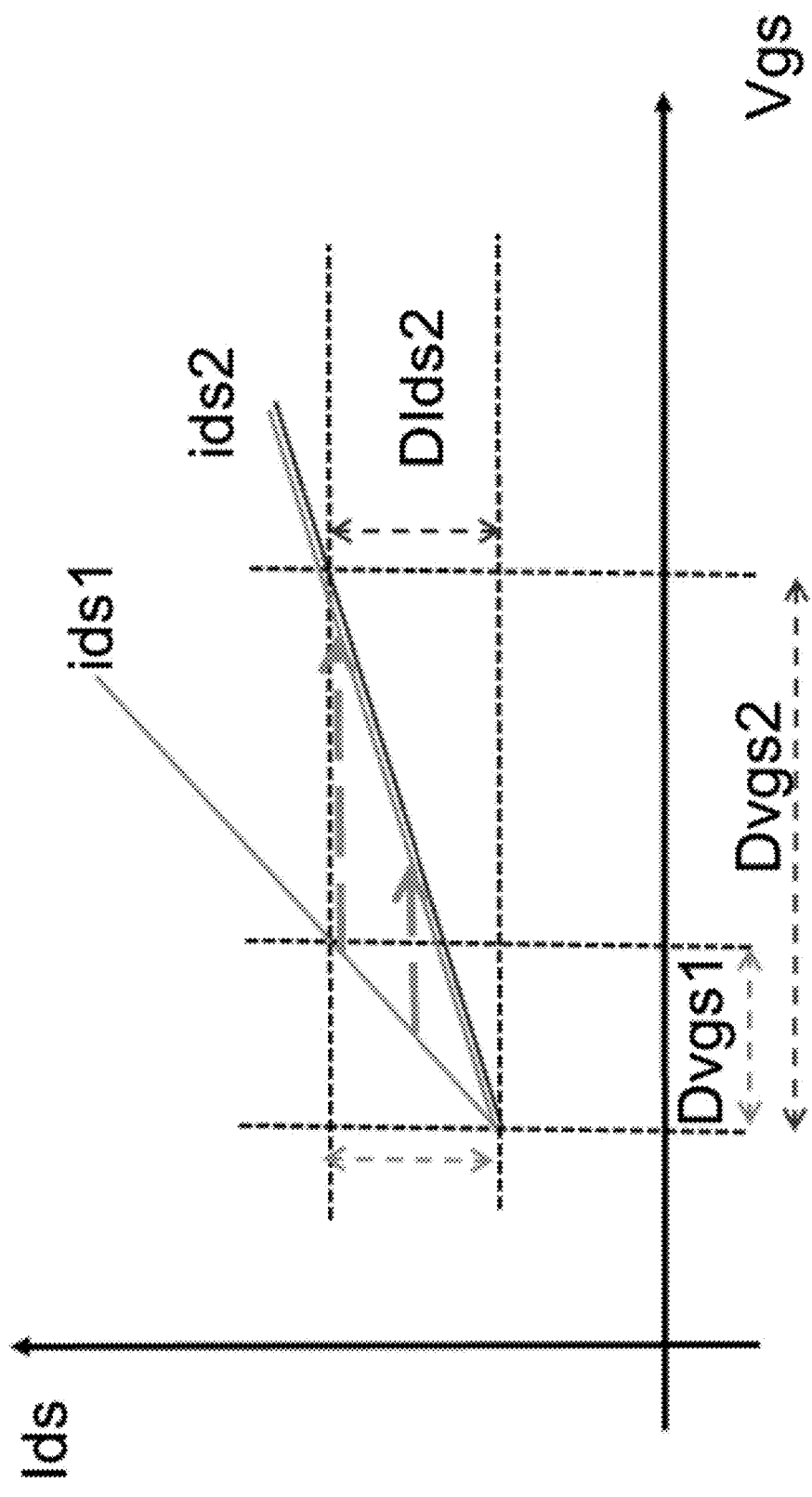
FIG. 33 depicts a system that compensates for differences in slope of the current-voltage characteristic curves of two devices in a system, such as reference memory cell and a selected memory cell.

This is shown graphically in FIG. 33, a voltage of Vgs1=a*Vgs2 is applied to device 1, which causes the slope of the current-voltage characteristic curve of the first device to approximate the slope of the current-voltage characteristic curve of the second device Embodiments for performing slope normalization between different devices will now be described.

Figure 34:
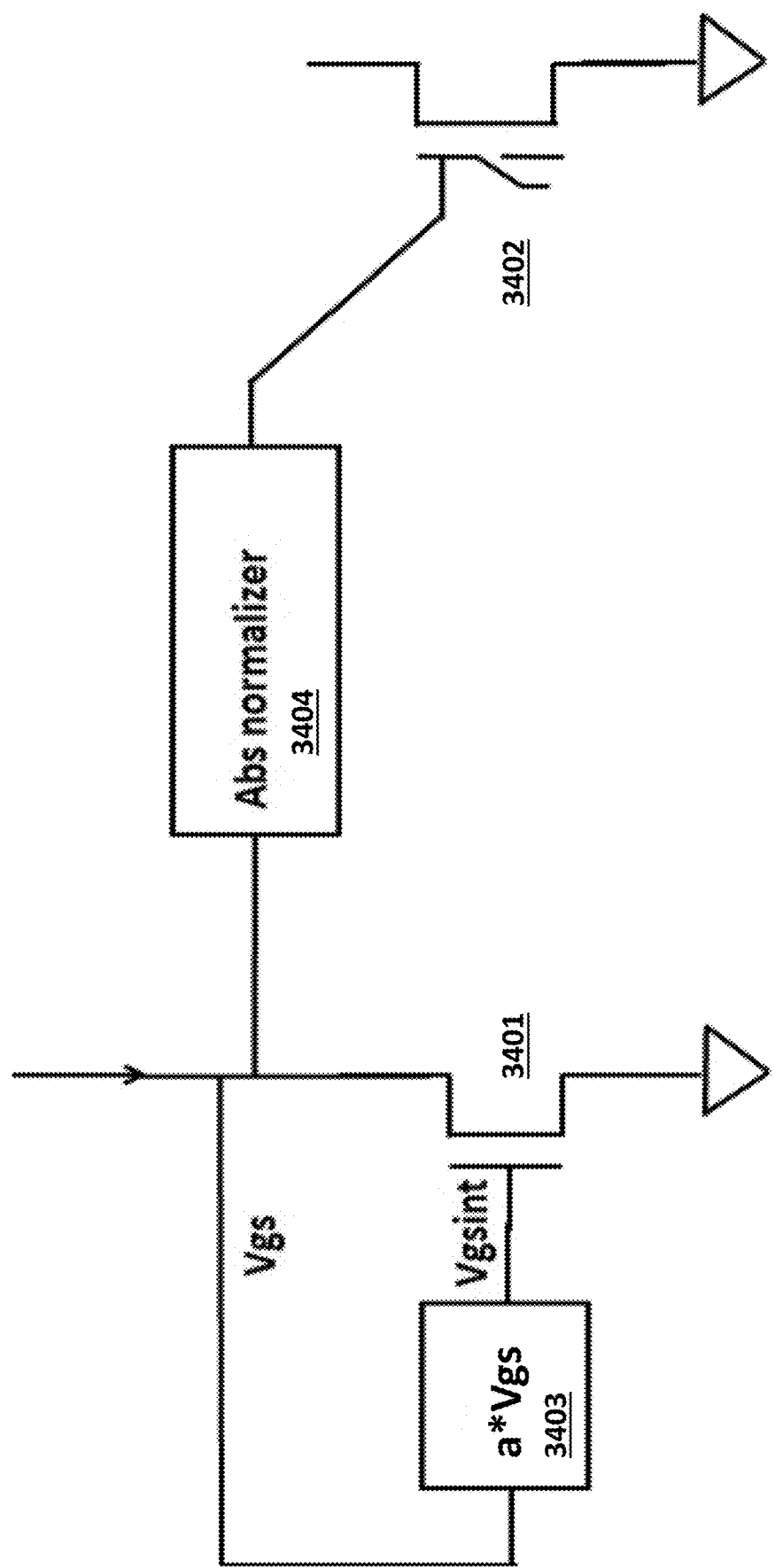
FIG. 34 depicts an embodiment of a slope compensation system.

FIG. 34 depicts slope normalization system 3400, comprising reference transistor 3401, selected memory cell 3402, gate driver 3403, and absolute normalizer circuit 3404. Gate driver 3403 receives an input voltage, Vgs, and multiplies that input voltage by a to generate an output voltage Vgsint, which is applied to the gate of reference transistor 3401. Absolute normalizer circuit 3404 can be a trimmable current mirror (a current mirror circuit to adjust the ratio between current from reference transistor 3401 and the output current from memory cell 3402), where the trimming process can adjust for discrepancies caused by reference or array transistor or from I-V slope mismatching. Selected memory cell 3402 is one of the memory cells in the array of memory cells.

Figure 35:
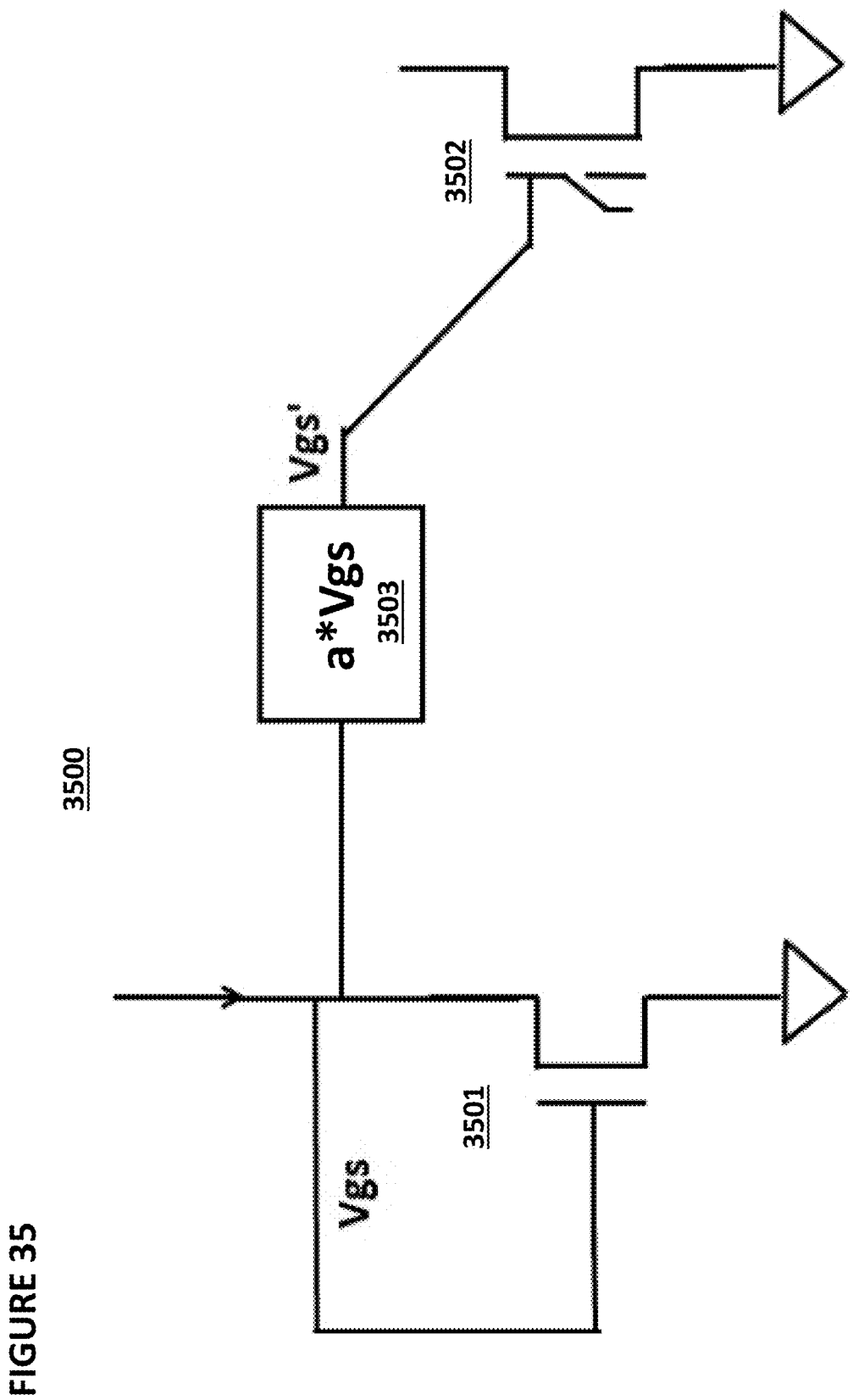
FIG. 35 depicts another embodiment of a slope compensation system.

FIG. 35 depicts slope normalization system 3500 comprising reference transistor 3501, selected memory cell 3502, and driver 3503. Driver 3503 receives voltage Vgs and multiplies it by a, resulting in an output voltage of Vgs'. Thus, reference transistor 3501 and selected memory cell 3502 will receive different voltages, where the difference accounts for the difference in slope.

Figure 38:
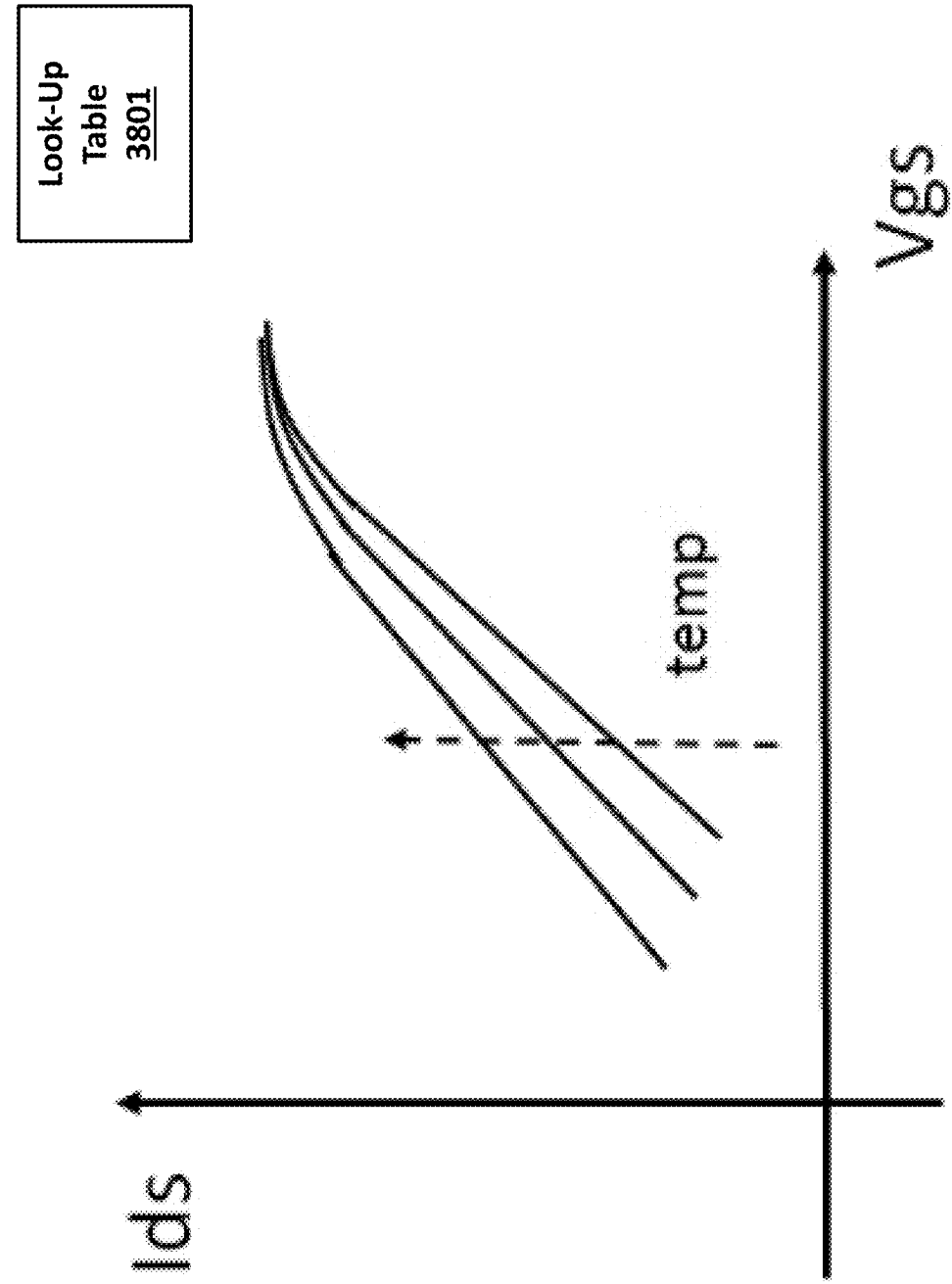
FIG. 38 depicts data stored in a look-up table to be used for compensating for slope differences.

FIG. 38 depicts an embodiment that utilizes look-up table 3801 to compensate for changes in current-voltage characteristic curves 3800 of devices due to changes in operating temperature. These devices can include transistors, reference memory cells, and selected memory cells. In this embodiment, the data of curves 3800 is stored in look-up table 3801, and during operation, k is determined from look-up table 3801 rather than through mathematical formulas. Look-up table 3801 can contain different desired output currents for each input voltage at various operating temperatures. This data can be populated in look-up table 3801 during the manufacturing or testing process.

The embodiments also can provide for leakage reduction. Specifically, leakage of a transistor or memory cell can be reduced by applying a negative voltage to the control gate terminal (such as a voltage between −0.1 V to −0.4 V), a negative voltage to the word line terminal (such as a voltage between −0.1 V and −0.4 V), a negative voltage to the erase gate terminal (such as a voltage between −0.1 V and −0.4 V), a reduced voltage on bitline at higher temperature, a decreased voltage on the bulk terminal (substrate) at higher temperature, or by applying a bias voltage on the source line terminal.

Figure 36:
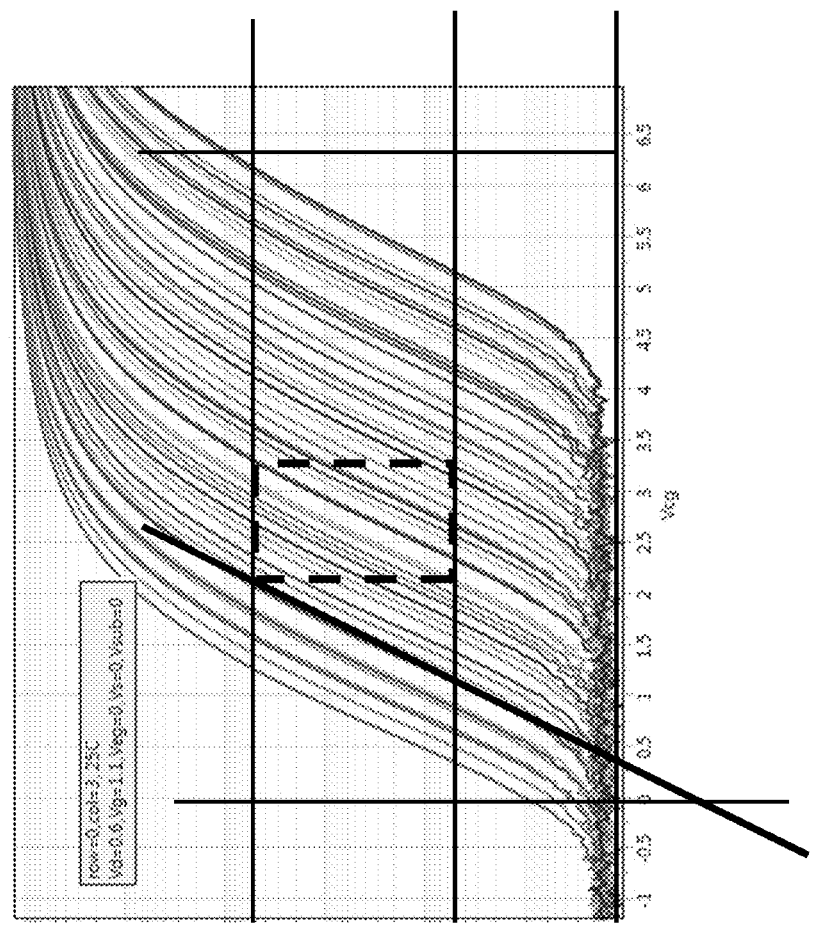
FIG. 36 depicts an embodiment for a leakage reduction system that applies a bias voltage to the control gate of a flash memory device.

FIG. 36 provides an illustration of a reduction in leakage current through the application of a voltage to the control gate terminal of a device. In this embodiment, a control gate bias voltage is selected such that I-lk=n*I-min/# of rows. If an example where an array comprises 256 rows×512 columns, it will be the case that 256*I-lkg<I-min. For example, I-min might be around 500 pA and Ilkg around 2 pA. This means that the control gate bias voltage would be around greater than 2 V.

In another embodiment for temperature compensation, a reversed substrate voltage (e.g., a negative voltage) is applied or the sourceline voltage is biased to extend the subthreshold operating voltage range by raising the floating gate threshold voltage, VtFG.

Figure 37:
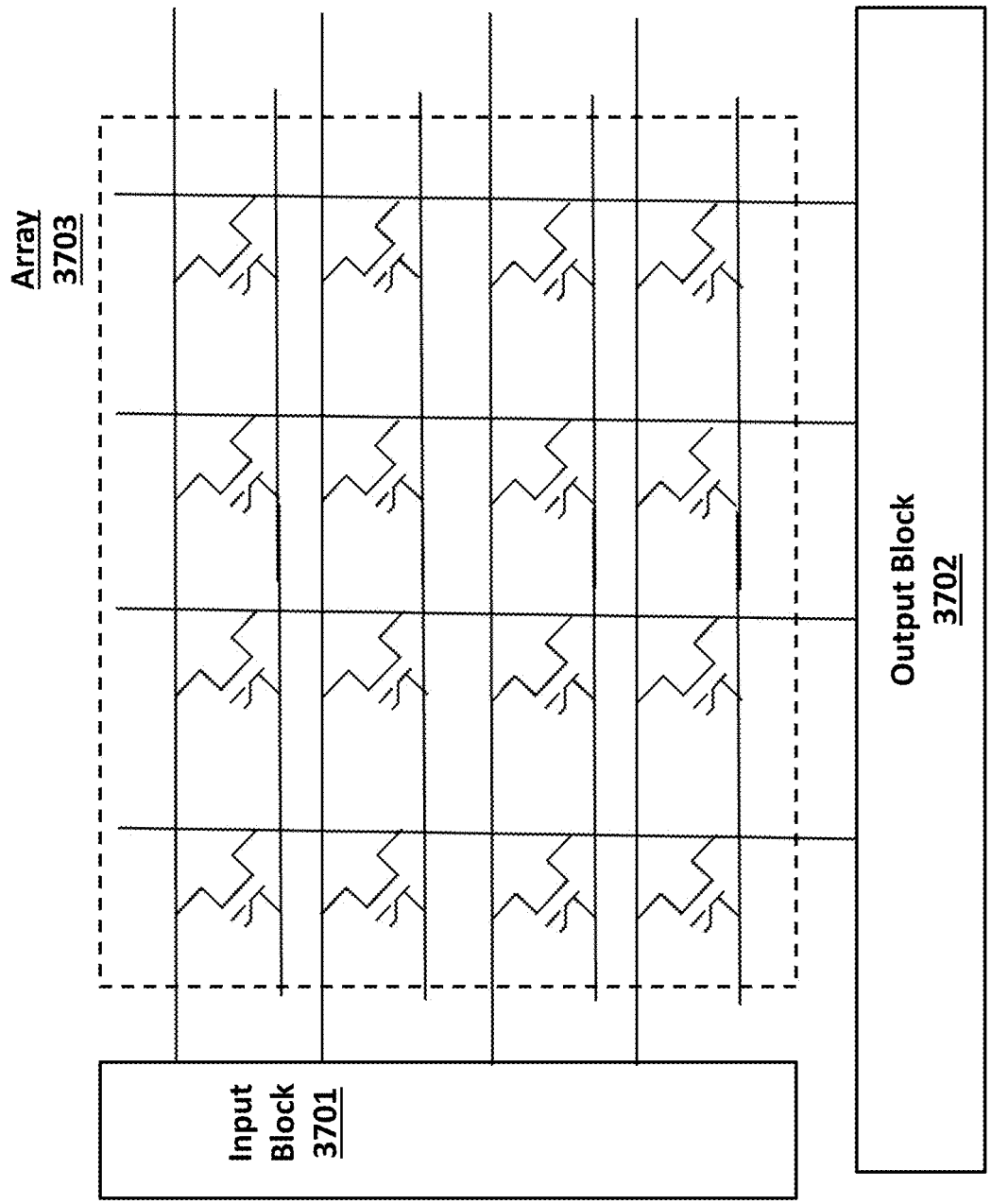
FIG. 37 depicts an array architecture that is suitable for memory cells operating in the linear region.

FIG. 37 shows an array architecture that is suitable for memory cells operating in linear region. System 3700 comprises input block 3701, output block 3702, and array 3703 of memory cells. Input block 3701 is coupled to the drains (source lines) of the memory cells in array 3703, and output block 3702 is coupled to the bit lines of the memory cells in array 3703. Alternatively, input block 3701 is coupled to the wordlines of the memory cells in array 3703, and output block 3702 is coupled to the bit lines of the memory cells in array 3703.

In instances where system 3700 is used to implement an LSTM or GRU, output block 3702 and/or input block 3701 may include multiplier block, addition block, subtraction (output=1−input) block as needed for LSTM/GRU architecture, and optionally may include analog sample-and-hold circuits or digital sample-and-hold circuits (e.g., a register or SRAM) as needed.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A method of compensating for temperature changes in an analog memory system comprising an array of memory cells, the method comprising:
   measuring an operating temperature within the array of memory cells;
   generating control bits, by a controller, in response to the operating temperature;
   adjusting one or more of an adjustable current source and an adjustable resistor using the control bits; and
   applying, by a temperature compensation block, a bias voltage to a terminal of a memory cell in the array of memory cells, wherein the bias voltage is generated by the one or more of the adjustable current source and the adjustable resistor.

2. The method of claim 1, wherein the terminal is a word line terminal.

3. The method of claim 1, wherein the terminal is a bit line terminal.

4. The method of claim 1, wherein the terminal is a source line terminal.

5. The method of claim 1, wherein the terminal is a control gate terminal.

6. The method of claim 1, wherein the terminal is an erase gate terminal.

7. The method of claim 1, wherein the memory cells in the array of memory cells are non-volatile memory cells.

8. The method of claim 7, wherein the non-volatile memory cells are split-gate flash memory cells.

9. The method of claim 7, wherein the non-volatile memory cells are stacked-gate flash memory cells.

10. The method of claim 1, wherein the measuring step is performed by a temperature sensor.

11. A method of compensating for temperature changes in a vector-by-matrix multiplier system comprising an array of memory cells, the method comprising:
    measuring an operating temperature within the vector-by-matrix multiplier system;
    generating control bits, by a controller, in response to the operating temperature;
    adjusting one or more of an adjustable current source and an adjustable resistor using the control bits; and
    applying, by a temperature compensation block, a bias voltage to a terminal of a memory cell in the array of memory cells, wherein the bias voltage is generated by the one or more of the adjustable current source and the adjustable resistor.

12. The method of claim 11, wherein the terminal is a word line terminal.

13. The method of claim 11, wherein the terminal is a bit line terminal.

14. The method of claim 11, wherein the terminal is a source line terminal.

15. The method of claim 11, wherein the terminal is a control gate terminal.

16. The method of claim 11, wherein the terminal is an erase gate terminal.

17. The method of claim 11, wherein the memory cells in the array of memory cells are non-volatile memory cells.

18. The method of claim 17, wherein the non-volatile memory cells are split-gate flash memory cells.

19. The method of claim 17, wherein the non-volatile memory cells are stacked-gate flash memory cells.

20. The method of claim 11, wherein the measuring step is performed by a temperature sensor.

* * * * *